US012806904B2

(12) United States Patent
Kim et al.

(10) Patent No.: US 12,806,904 B2
(45) Date of Patent: Nov. 24, 2026

(54) INKJET PRINTING APPARATUS

(71) Applicant: Samsung Display Co., LTD., Yongin-si (KR)

(72) Inventors: Ran Kim, Yongin-si (KR); Sung Hwan Youn, Yongin-si (KR); Ki Hyun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 118 days.

(21) Appl. No.: 18/812,079

(22) Filed: Aug. 22, 2024

(65) Prior Publication Data

US 2025/0229535 A1 Jul. 17, 2025

(30) Foreign Application Priority Data

Jan. 12, 2024 (KR) ........................ 10-2024-0005185

(51) Int. Cl.

| | |
|---|---|
| ***B41J 2/16*** | (2006.01) |
| ***B41J 2/01*** | (2006.01) |
| ***B41J 2/14*** | (2006.01) |
| *B41J 3/407* | (2006.01) |
| *H10K 71/13* | (2023.01) |

(52) U.S. Cl.

CPC ............... *B41J 2/1606* (2013.01); *B41J 2/01* (2013.01); *B41J 2/14* (2013.01); *B41J 2/14201* (2013.01); *B41J 3/407* (2013.01); *H10K 71/135* (2023.02)

(58) Field of Classification Search

CPC ........ B41J 2/1606; B41J 2/14201; B41J 2/01; B41J 2/14; B41J 3/407; H10K 71/135

See application file for complete search history.

(56) References Cited

U.S. PATENT DOCUMENTS

| | | | | |
|---|---|---|---|---|
| 2006/0132541 A1* | 6/2006 | Nishijima | B41J 2/1642 | 347/47 |
| 2010/0053269 A1* | 3/2010 | Fujii | B41J 2/1629 | 347/45 |
| 2010/0231647 A1* | 9/2010 | Uchiyama | B41J 2/1606 | 427/337 |
| 2013/0027470 A1* | 1/2013 | Kato | B41J 2/14233 | 347/45 |

FOREIGN PATENT DOCUMENTS

| | | | |
|---|---|---|---|
| JP | 08118656 A * | 5/1996 | B41J 2/135 |
| KR | 10-2019-0090108 | 8/2019 | |

* cited by examiner

*Primary Examiner* — Yaovi M Ameh

(74) *Attorney, Agent, or Firm* — CANTOR COLBURN LLP

(57) ABSTRACT

An inkjet printing apparatus includes a base portion, an inner pipe disposed in the base portion and through which ink moves, and a nozzle extending from the inner pipe and discharging the ink. The nozzle includes a coating layer disposed on an inner side surface of the nozzle and including AlOF.

12 Claims, 15 Drawing Sheets

INKJET PRINTING APPARATUS

CROSS-REFERENCE TO RELATED APPLICATION(S)

This application claims priority to and benefits of Korean Patent Application No. 10-2024-0005185 under 35 U.S.C. 119, filed on Jan. 12, 2024, in the Korean Intellectual Property Office (KIPO), the entire contents of which are incorporated herein by reference.

BACKGROUND

1. Technical Field

The disclosure relates to an inkjet printing apparatus.

2. Description of the Related Art

The importance of a display device is increasing with the development of multimedia. Accordingly, various types of display devices such as an organic light emitting display (OLED) and a liquid crystal display (LCD) are being used.

The display device includes a display panel such as an organic light emitting display panel or a liquid crystal display panel as a device for displaying an image of the display device. An example of the light emitting display panel among the display panels may include a light emitting element such as a light emitting diode (LED), and examples of such a light emitting diode include an organic light emitting diode (OLED) that uses an organic material as a fluorescent material, an inorganic light emitting diode that uses an inorganic material as a fluorescent material, and the like.

An inkjet printing apparatus may be used to form an organic material layer included in the display device or to form a wavelength conversion layer including quantum dots. After printing any ink or solution using an inkjet, a post-processing process may be performed to form the quantum dots or organic material layer. When performing a process using the inkjet printing apparatus, impact defects of ink may occur as the process time increases.

SUMMARY

Aspects of the disclosure provide an inkjet printing apparatus capable of reducing impact defects of ink.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, an inkjet printing apparatus may include a base portion, an inner pipe disposed in the base portion and through which ink moves, and a nozzle extending from the inner pipe and discharging the ink. The nozzle may include a coating layer disposed on an inner side surface of the nozzle and including AlOF.

In an embodiment, the nozzle may further include an inclined surface extending from the inner pipe, and a discharge surface extending from the inclined surface to a lower side of the nozzle, and the coating layer may be disposed on the discharge surface.

In an embodiment, the coating layer may be spaced apart from the inclined surface and is in direct contact with the discharge surface.

In an embodiment, the coating layer may include a first coating layer disposed on an inner side surface of the nozzle, and a second coating layer disposed on the first coating layer.

In an embodiment, the first coating layer may include at least one of a Group II element, a Group III element, a Group IV element, a Group V element, and a Group VI element.

In an embodiment, the first coating layer may include at least one of Cd, Se, Te, Zn, S, Mg, In, Ga, Sb, Al, and Pb.

In an embodiment, a thickness of the first coating layer may be in a range of about 10 nm to about 100 nm.

In an embodiment, the second coating layer may be directly disposed on the first coating layer and includes the AlOF.

In an embodiment, a thickness of the second coating layer may be in a range of about 40 nm to about 900 nm.

In an embodiment, the inkjet printing apparatus may further include a third coating layer disposed on the second coating layer. The third coating layer may include a metal oxide.

In an embodiment, a thickness of the third coating layer may be in a range of about 100 nm to about 500 nm.

In an embodiment, a thickness of the coating layer may be in a range of about 50 nm to about 1000 nm.

In an embodiment, the coating layer may be formed of a single layer.

In an embodiment, the coating layer may include at least one of a Group II element, a Group III element, a Group IV element, a Group V element, a Group VI element, AlOF, and a metal oxide.

According to an embodiment of the disclosure, an inkjet printing apparatus may include a base portion, an inner pipe disposed in the base portion and through which ink moves, and a nozzle extending from the inner pipe and discharging the ink. The nozzle may include a coating layer disposed on an inner side surface of the nozzle and including a liquid-repellent material.

In an embodiment, the nozzle may further include an inclined surface extending from the inner pipe, and a discharge surface extending from the inclined surface to a lower side of the nozzle, and the coating layer may be disposed on the discharge surface.

In an embodiment, the coating layer may be spaced apart from the inclined surface.

In an embodiment, a thickness of the coating layer may be in a range of about 1 nm to about 100 nm.

In an embodiment, a length of the coating layer in a thickness direction of the nozzle may be greater than or equal to about 2 m and may be smaller than a length of the inner side surface of the nozzle in the thickness direction of the nozzle.

In an embodiment, the inkjet printing apparatus may further include a discharge portion where the nozzle is disposed, and a first liquid-repellent layer disposed on a lower surface of the discharge portion. The coating layer may extend from a side surface of the first liquid-repellent layer to the inner side surface of the nozzle.

The inkjet printing apparatus according to an embodiment may prevent an impact distribution of ink from increasing by forming a coating layer on an inner side surface of a nozzle and adjusting and managing a thickness of the coating layer. Accordingly, coating defects in the inkjet printing apparatus may be reduced.

However, the effects of the embodiments are not restricted to the one set forth herein. The above and other effects of the embodiments will become more apparent to one of ordinary skill in the art to which the embodiments pertain by referencing the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
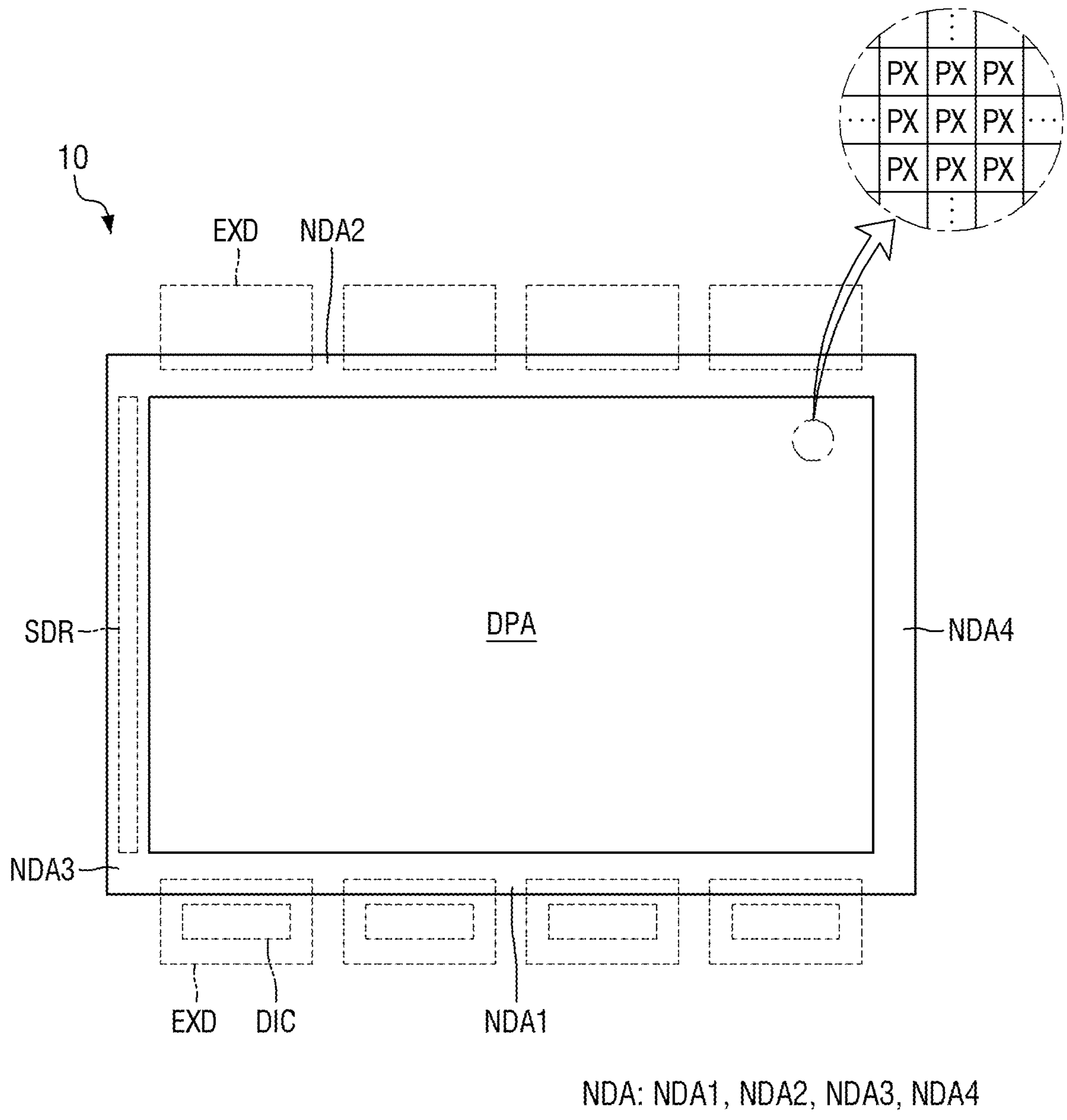
FIG. 1 is a plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

FIG. 1 is a plan view of a display device according to an embodiment.

Referring to FIG. 1, a display device 10 according to an embodiment may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, car navigation systems, vehicle instrument boards, digital cameras, camcorders, external billboards, electric signs, medical devices, inspection devices, various home appliances such as refrigerators and washing machines, or Internet of Things (IoT) devices. In the specification, a television (TV) will be described as an embodiment of the display device 10, and the TV may have high resolution or ultra-high resolution such as high definition (HD), ultra-high definition (UHD), 4K, or 8K.

The display device 10 according to an embodiment may be variously classified according to a display method. For example, the display device 10 may include an organic light emitting display (OLED), an inorganic light emitting display (inorganic EL), a quantum dot light emitting display (QED), a micro LED, a nano LED, a plasma display panel (PDP), a field emission display (FED), a cathode ray tube display (CRT), a liquid crystal display (LCD), an electrophoretic display (EPD), and the like. In the following, an organic light emitting display device and an inorganic light emitting display device will be described as an embodiment of the display device 10, and unless a special distinction is required, an organic light emitting display device applied to an embodiment will be simply abbreviated as a display device. However, the disclosure is not limited to the organic light emitting display device or the inorganic light emitting display device, and other display devices listed above or known in the art may also be applied within the scope of technical art.

The display device 10 according to an embodiment may have a square shape in a plan view, for example, a rectangular shape. In case that the display device 10 is a television, the display device 10 may have a long side extending in a horizontal direction. However, the disclosure is not limited thereto, and the long side of the display device 10 may extend in a vertical direction, and the display device 10 may be rotatable, so that the long side of the display device 10 may be variably positioned in the horizontal or vertical direction.

The display device 10 may include a display area DPA and a non-display area NDA. The display area DPA may be an active area in which an image is displayed. The display area DPA may have a rectangular shape in a plan view, similar to the overall shape of the display device 10, but is not limited thereto.

The display area DPA may include multiple pixels PX. The pixels PX may be arranged in a matrix direction. A shape of each pixel PX may be a rectangular shape or a square shape in a plan view, but is not limited thereto, and may be a rhombic shape of which each side is inclined with respect to a direction of a side of the display device 10. The pixels PX may include multiple color pixels PX. For example, the pixels PX may include, but are not limited to, a first color pixel PX of red, a second color pixel PX of green, and a third color pixel PX of blue. Each color pixel PX may be alternately arranged in a stripe type or PenTile™ type.

The non-display area NDA may be disposed adjacent to the display area DPA. The non-display area NDA may entirely or partially surround the display area DPA in a plan view. The display area DPA may have a rectangular shape, and the non-display area NDA may be disposed adjacent to four sides of the display area DPA. The non-display area NDA may constitute a bezel of the display device 10.

A driving circuit or a driving element for driving the display area DPA may be disposed in the non-display area NDA. In an embodiment, pad portions may be provided on a display substrate of the display device 10 in a first non-display area NDA1 disposed adjacent to a first long side (lower side in FIG. 1) of the display device 10 and a second non-display area NDA2 disposed adjacent to a second long side (upper side in FIG. 1) of the display device 10, and external devices EXD may be mounted on pad electrodes of the pad portions. Examples of the external devices EXD may include a connection film, a printed circuit board, a driving chip (DIC), a connector, a line connection film, and the like. A scan driver SDR and the like formed directly on the display substrate of the display device 10 may be disposed in a third non-display area NDA3 disposed adjacent to a first short side (left side in FIG. 1) of the display device 10. However, the disclosure is not limited thereto, and the scan driver SDR may be disposed on a second short side (right side in FIG. 1) of the display device 10.

Figure 2:
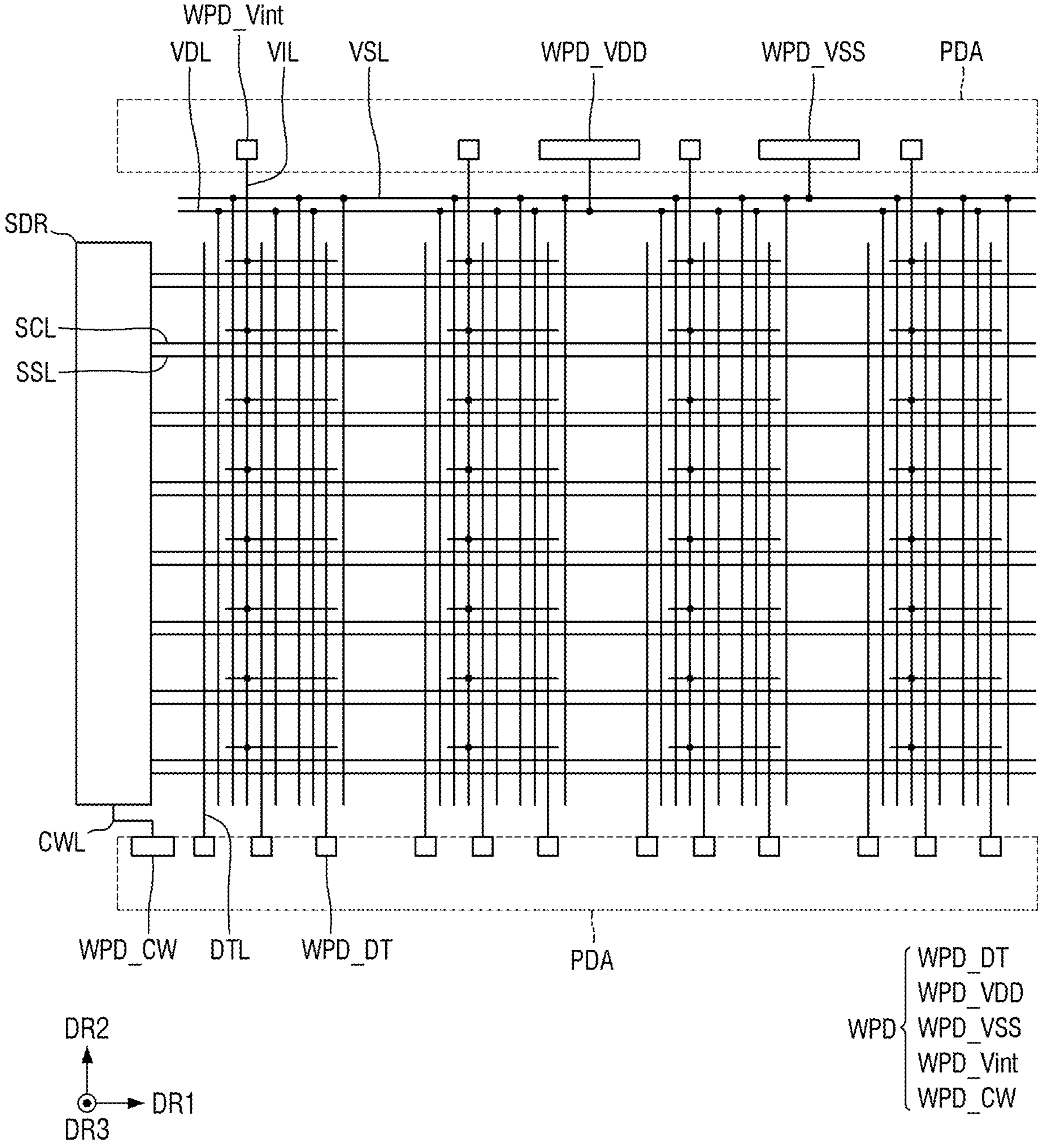
FIG. 2 is a schematic layout view illustrating lines included in the display device according to an embodiment.

FIG. 2 is a schematic layout view illustrating lines included in the display device according to an embodiment.

Referring to FIG. 2, the display device 10 may include multiple lines. The lines may include a scan line SCL, a sensing line SSL, a data line DTL, an initialization voltage line VIL, a first voltage line VDL, and a second voltage line VSL. Although not illustrated in the drawing, other lines may be further disposed in the display device 10.

The scan line SCL and the sensing line SSL may extend in a first direction DR1. The scan line SCL and the sensing line SSL may be connected to the scan driver SDR. The scan driver SDR may include a driving circuit. The scan driver SDR may be disposed on a side of the display area DPA in the first direction DR1, but is not limited thereto. The scan driver SDR may be connected to a signal connection line CWL, and at least one end of the signal connection line CWL may be connected to an external device by forming a pad WPD_CW on a pad area PDA of the non-display area.

In the specification, it may be understood that any one portion and another portion as one integrated member are interconnected due to the integrated member.

The data line DTL and the initialization voltage line VIL may extend in a second direction DR2 intersecting the first direction DR1. The initialization voltage line VIL may further include a portion extending in the second direction DR2 and a portion branching in the first direction DR1. The first voltage line VDL and the second voltage line VSL may also include portions extending in the second direction DR2 and portions connected and extending in the first direction DR1. The first voltage line VDL and the second voltage line VSL may have a mesh structure, but are not limited thereto. Although not illustrated in the drawing, each of the pixels PX of the display device 10 may be connected to one or more data lines DTL, initialization voltage lines VIL, first voltage lines VDL, and second voltage lines VSL.

The data line DTL, the initialization voltage line VIL, the first voltage line VDL, and the second voltage line VSL may be electrically connected to at least one line pad WPD. Each line pad WPD may be disposed in the pad area PDA. In an embodiment, a line pad WPD_DT (hereinafter, also referred to as 'data pad') of the data line DTL may be disposed in a pad area PDA on a side of the display area DPA in the second direction DR2, and a line pad WPD_Vint (hereinafter, 'initialization voltage pad') of the initialization voltage line VIL, a line pad WPD_VDD (hereinafter, also referred to as 'first power pad') of the first voltage line VDL, and a line pad WPD_VSS (hereinafter, also referred to as 'second power pad') of the second voltage line VSL may be disposed in a pad area PDA positioned on another side of the display area DPA in the second direction DR2. In another embodiment, the data pad WPD_DT, the initialization voltage pad WPD_Vint, the first power pad WPD_VDD, and the second power pad WPD_VSS may all be disposed in a same area, for example, in the non-display area NDA positioned on an upper side of the display area DPA. The external device EXD may be mounted on the line pad WPD. The external device EXD may be mounted on the line pad WPD through an anisotropic conductive film, ultrasonic bonding, or the like.

Each pixel PX or sub-pixel PXn (n is an integer of 1 to 3) of the display device 10 may include a pixel driving circuit. The above-described lines may apply a driving signal to each pixel driving circuit while passing through each pixel PX or passing around each pixel PX. The pixel driving circuit may include a transistor and a capacitor. The numbers of transistors and capacitors in each pixel driving circuit may be variously changed. According to an embodiment, each sub-pixel SPXn of the display device 10 may have a 3T1C structure in which the pixel driving circuit includes three transistors and one capacitor. Hereinafter, the pixel driving circuit will be described using the 3T1C structure as an embodiment, but the disclosure is not limited thereto, and various other modified pixel PX structures such as a 2T1C structure, a 7T1C structure, and a 6T1C structure may also be applied.

Figure 3:
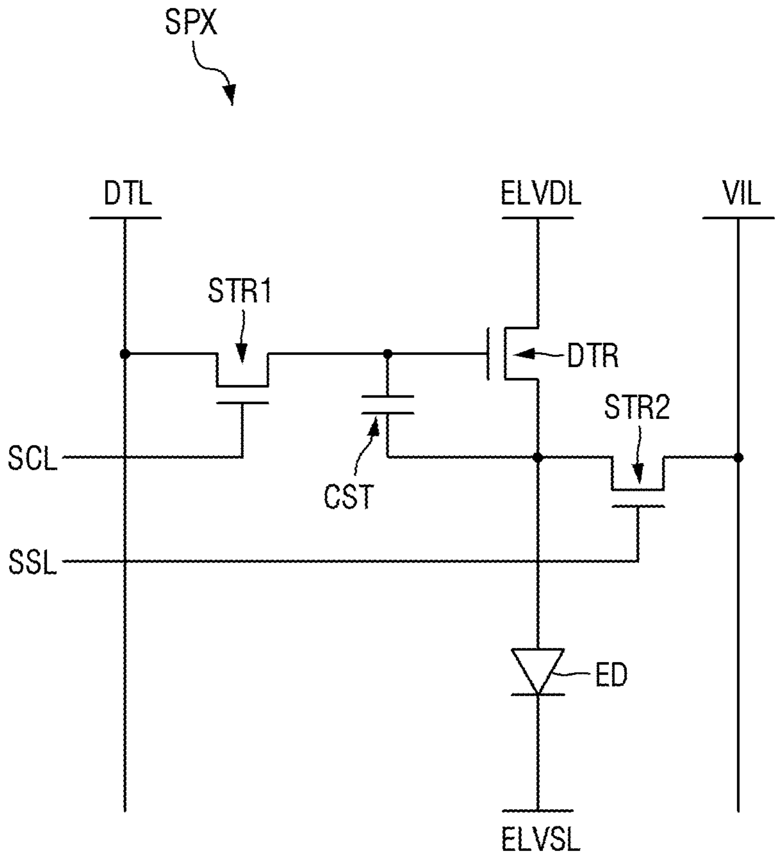
FIG. 3 is a schematic diagram of an equivalent circuit of one sub-pixel according to an embodiment.

FIG. 3 is a schematic diagram of an equivalent circuit of one sub-pixel according to an embodiment.

Referring to FIG. 3, each sub-pixel SPX of the display device 10 according to an embodiment may include three transistors DTR, STR1, and STR2 and one storage capacitor CST, in addition to a light emitting element ED.

The light emitting element ED may emit light according to a current supplied through a driving transistor DTR. The light emitting element ED may be implemented as an inorganic light emitting diode, an organic light emitting diode, a micro light emitting diode, a nano light emitting diode, or the like.

A first electrode (i.e., an anode electrode) of the light emitting element ED may be connected to a source electrode of the driving transistor DTR, and a second electrode (i.e., a cathode electrode) of the light emitting element ED may be connected to a second power line ELVSL to which a low potential voltage (second power voltage) lower than a high potential voltage (first power voltage) of a first power line ELVDL is supplied.

The driving transistor DTR may adjust a current flowing from the first power line ELVDL to which the first power is supplied to the light emitting element ED according to a voltage difference between a gate electrode and the source electrode of the driving transistor DTR. The gate electrode of the driving transistor DTR may be connected to a first electrode of a first transistor STR1, the source electrode of the driving transistor DTR may be connected to the first electrode of the light emitting element ED, and a drain electrode of the driving transistor DTR may be connected to the first power line ELVDL to which the first power voltage is applied.

The first transistor STR1 may be turned on by a scan signal of the scan line SCL and connect the data line DTL to the gate electrode of the driving transistor DTR. A gate electrode of the first transistor STR1 may be connected to the scan line SCL, the first electrode of the first transistor STR1 may be connected to the gate electrode of the driving transistor DTR, and a second electrode of the first transistor STR1 may be connected to the data line DTL.

A second transistor STR2 may be turned on by a sensing signal of the sensing signal line SSL and connect the initialization voltage line VIL to the source electrode of the driving transistor DTR. A gate electrode of the second transistor STR2 may be connected to the sensing signal line SSL, a first electrode of the second transistor STR2 may be connected to the initialization voltage line VIL, and a second electrode of the second transistor STR2 may be connected to the source electrode of the driving transistor DTR.

In an embodiment, the first electrode of each of the first and second transistors STR1 and STR2 may be a source electrode, and the second electrode of each of the first and second transistors STR1 and STR2 may be a drain electrode, but the disclosure is not limited thereto, and vice versa.

A capacitor CST may be formed between the gate electrode and the source electrode of the driving transistor DTR. The storage capacitor CST may store a difference in voltage between a gate voltage and a source voltage of the driving transistor DTR.

The driving transistor DTR and the first and second transistors STR1 and STR2 may be formed as thin film transistors. It is described in FIG. 3 that the driving transistor DTR and the first and second transistors STR1 and STR2 are N-type metal oxide semiconductor field effect transistors (MOSFETs), but the disclosure is not limited thereto. For example, the driving transistor DTR and the first and second transistors STR1 and STR2 may be P-type MOSFETs, or some of the driving transistor DTR and the first and second transistors STR1 and STR2 may be N-type MOSFETs and others may be P-type MOSFETs.

Figure 4:
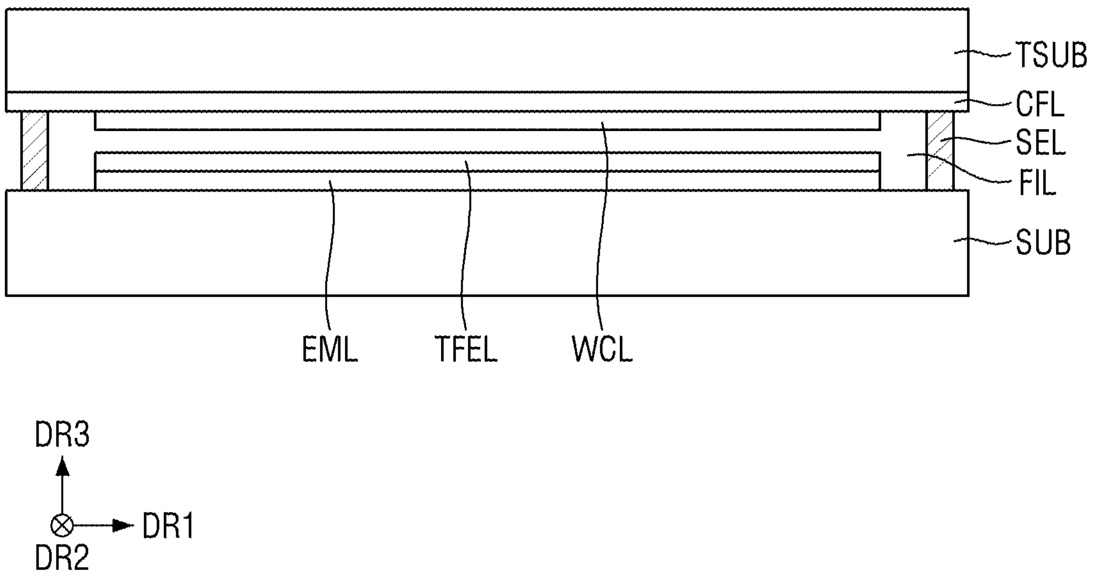
FIG. 4 is a schematic cross-sectional view of the display device according to an embodiment.
Figure 5:
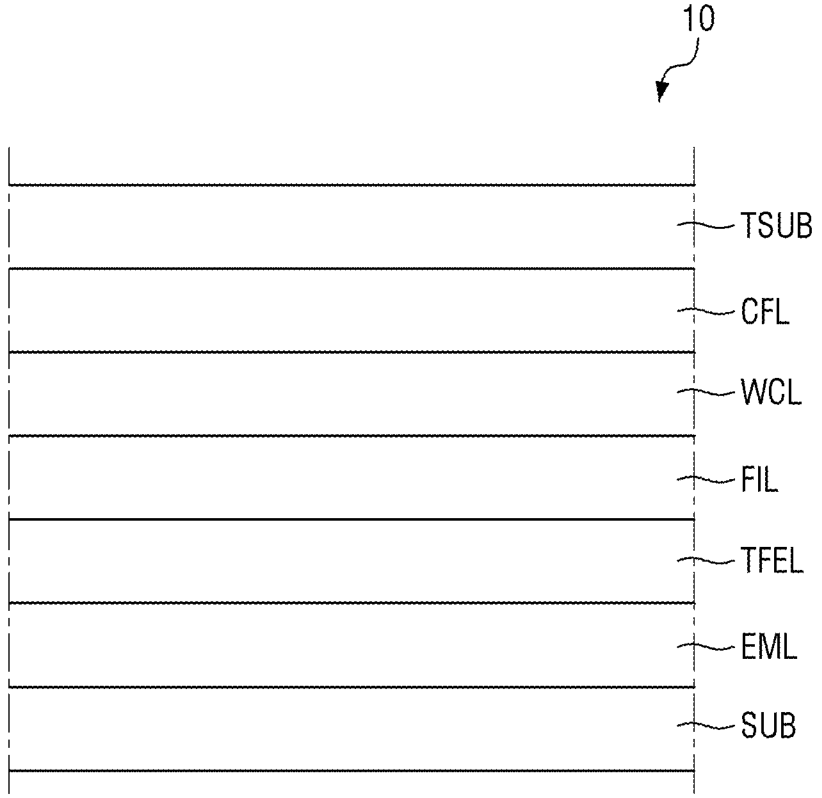
FIG. 5 is a schematic cross-sectional view of a display area of the display device according to an embodiment.

FIG. 4 is a schematic cross-sectional view of the display device according to an embodiment. FIG. 5 is a schematic cross-sectional view of a display area of the display device according to an embodiment.

Referring to FIGS. 4 and 5, the display device 10 according to an embodiment may include a substrate SUB, a light emitting element layer EML, a thin film encapsulation layer TFEL, a filling layer FIL, a wavelength conversion layer WCL, a color filter layer CFL, a counter substrate TSUB, and a coupling member SEL.

The substrate SUB may be an insulating substrate. The substrate SUB may include a transparent material. For example, the substrate SUB may include a transparent insulating material such as glass or quartz. The substrate SUB may be a rigid substrate. However, the substrate SUB is not limited thereto, and may include plastic such as polyimide and may have flexible properties capable of being curved, bent, folded, or rolled.

The light emitting element layer EML may be disposed on the substrate SUB. The light emitting element layer EML may include multiple switching elements and multiple light emitting elements ED disposed in each sub-pixel. The switching elements may drive the light emitting elements ED to emit light from the light emitting elements ED.

The thin film encapsulation layer TFEL may be disposed on the light emitting element layer EML. The thin film encapsulation layer TFEL may include an organic film disposed between multiple inorganic films, thereby protecting the light emitting element layer EML from external moisture and oxygen.

A counter substrate TSUB may be disposed opposite to the substrate SUB. The counter substrate TSUB may encapsulate the light emitting element layer EML together with the substrate SUB. The counter substrate TSUB may include a transparent material. For example, the counter substrate TSUB may include a transparent insulating material such as glass or quartz.

A color filter layer CFL may be disposed on a surface of the counter substrate TSUB. The color filter layer CFL may filter light incident from the outside to reduce reflection of external light and improve color characteristics of light emitted through the wavelength conversion layer WCL.

The wavelength conversion layer WCL may be disposed on a surface of the color filter layer CFL. The wavelength conversion layer WCL may convert a wavelength of light emitted from the light emitting element layer EML to emit red light, green light, and blue light.

A filling layer FIL may be disposed between the substrate SUB and the counter substrate TSUB. The filling layer FIL may be filled between the substrate SUB and the counter substrate TSUB to protect the display area of the display device 10.

The substrate SUB and the counter substrate TSUB may be coupled to each other by the coupling member SEL. The coupling member SEL may encapsulate the light emitting element layer EML by coupling the substrate SUB and the counter substrate TSUB to each other. The coupling member SEL may be disposed in the non-display area and surround the display area of the display device 10 in a plan view.

Hereinafter, the configurations of the display device according to an embodiment will be described in detail with reference to other drawings.

Figure 6:
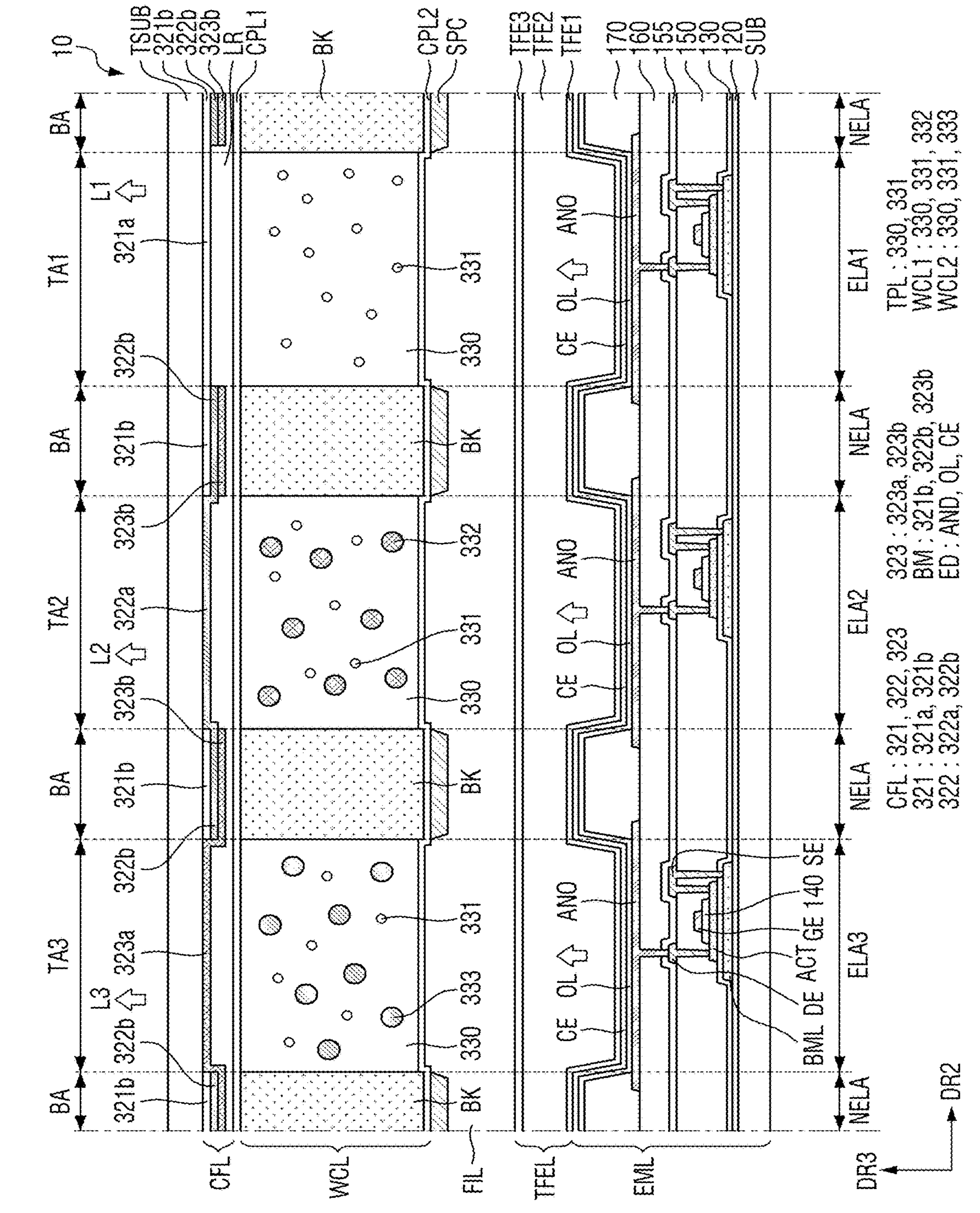
FIG. 6 is a schematic cross-sectional view of the display device according to an embodiment.

FIG. 6 is a schematic cross-sectional view of the display device according to an embodiment. FIG. 6 schematically illustrates a portion of the display area of the display device.

Referring to FIG. 6 together with FIG. 5, the light emitting element layer EML may be disposed on the substrate SUB. The light emitting element layer EML may include a buffer layer 120, a lower metal layer BML, a first insulating layer 130, a semiconductor layer ACT, a gate electrode GE, a gate insulating layer 140, a second insulating layer 150, a source electrode SE, a drain electrode DE, a third insulating layer 155, a fourth insulating layer 160, a light emitting element ED, and a pixel defining film 170.

The buffer layer 120 may be disposed on the substrate SUB. The buffer layer 120 may serve to block foreign substances or moisture from permeating into an element disposed on the buffer layer 120 through the substrate SUB.

The buffer layer 120 may include an inorganic material such as $SiO_2$, $SiN_x$, or SiON, and may be formed as a single layer or a multi-layer, but is not limited thereto.

The lower metal layer BML may be disposed on the buffer layer 120. The lower metal layer BML may block external light or light emitted from a light emitting element to be described below from being introduced into the semiconductor layer ACT. Accordingly, it may be possible to prevent leakage current from occurring due to light in a thin film transistor, which will be described below, or to reduce the occurrence of leakage current.

The lower metal layer BML may be formed of a material that blocks light and has conductivity. In some embodiments, the lower metal layer BML may include at least one of silver (Ag), nickel (Ni), gold (Au), platinum (Pt), aluminum (Al), copper (Cu), molybdenum (Mo), titanium (Ti), and neodymium (Nd), or an alloy thereof. In some embodiments, the lower metal layer BML may have a single layer or a multi-layer structure. For example, in case that the lower metal layer BML has a multi-layer structure, the lower metal layer BML may have a stacked structure of titanium (Ti)/copper (Cu)/indium tin oxide (ITO) or a stacked structure of titanium (Ti)/copper (Cu)/aluminum oxide ($Al_2O_3$), but is not limited thereto.

In some embodiments, the lower metal layer BML may be provided in plural to correspond to each semiconductor layer ACT and may overlap the semiconductor layer ACT in a plan view. In some embodiments, a width of the lower metal layer BML may be greater than a width of the semiconductor layer ACT.

In some embodiments, the lower metal layer BML may be a portion of a data line, a power supply line, or a wiring electrically connecting a thin film transistor (not illustrated) and a thin film transistor (GE, ACT, DE, and SE in FIG. 6) illustrated in the drawing to each other. In some embodiments, the lower metal layer BML may be made of a material having a lower resistance than the source electrode SE and the drain electrode DE.

The first insulating layer 130 may be disposed on the lower metal layer BML. The first insulating layer 130 may serve to electrically insulate the lower metal layer BML and the semiconductor layer ACT from each other. The first insulating layer 130 may cover the lower metal layer BML.

The first insulating layer 130 may include an inorganic material such as $SiO_2$, $SiN_x$, SiON, $Al_2O_3$, $TiO_2$, $Ta_2O$, $HfO_2$, or $ZrO_2$, but is not limited thereto.

The semiconductor layer ACT may be disposed on the first insulating layer 130. The semiconductor layer ACT may be disposed to correspond to the first light emitting area ELA1, the second light emitting area ELA2, and the third light emitting area ELA3 in the display area DPA, respectively. The semiconductor layer ACT may overlap each lower metal layer BML in a plan view, thereby suppressing generation of a photocurrent in the semiconductor layer ACT.

The semiconductor layer ACT may include an oxide semiconductor. In some embodiments, the semiconductor layer ACT may be formed of Zn oxide-based materials such as Zn oxide, In—Zn oxide, and Ga—In—Zn oxide, or may be an IGZO (In—Ga—Zn—O) semiconductor containing metal such as indium (In) and gallium (Ga) in ZnO, but is not limited thereto. For example, the semiconductor layer ACT may include amorphous silicon or polysilicon.

The gate electrode GE may be disposed on the semiconductor layer ACT. The gate electrode GE may overlap the semiconductor layer ACT in a plan view in the display area DPA. In some embodiments, a width of the gate electrode GE may be less than a width of the semiconductor layer ACT, but is not limited thereto.

The gate electrode GE may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of adhesiveness with adjacent layers, surface flatness of stacked layers, processability, and the like, and may be formed of a single layer or a multi-layer, but is not limited thereto.

The gate insulating layer 140 may be disposed between the semiconductor layer ACT and the gate electrode GE. The gate insulating layer 140 may serve to insulate the semiconductor layer ACT and the gate electrode GE from each other. In some embodiments, the gate insulating layer 140 may be not formed of one layer disposed on a side of a first substrate 110 in the third direction DR3, but may have a partially patterned shape, and a width of the gate insulating layer 140 may be less than the width of the semiconductor layer ACT and may be greater than the width of the gate electrode GE, but is not limited thereto.

The gate insulating layer 140 may include an inorganic material. For example, the gate insulating layer 140 may include the inorganic material exemplified in the description of the first insulating layer 130.

The second insulating layer 150 may be disposed on the gate insulating layer 140 and cover the semiconductor layer ACT and the gate electrode GE. In some embodiments, the second insulating layer 150 may function as a planarization film that provides a flat surface.

The second insulating layer 150 may include an organic material. In some embodiments, the second insulating layer 150 may include at least one of photo acryl (PAC), polystyrene, polymethyl methacrylate (PMMA), polyacrylonitrile (PAN), polyamide, polyimide, polyarylether, heterocyclic polymer, parylene, a fluorine-based polymer, an epoxy resin, a benzocyclobutene series resin, a siloxane series resin, and a silane resin, but is not limited thereto.

In some embodiments, the second insulating layer 150 may include an inorganic material. For example, the second insulating layer 150 may include the inorganic material exemplified in the description of the first insulating layer 130.

The source electrode SE and the drain electrode DE may be spaced apart from each other and disposed on the second insulating layer 150. The source electrode SE and the drain electrode DE may each be connected to the semiconductor layer ACT through a contact hole penetrating through the second insulating layer 150. The source electrode SE may penetrate through not only the second insulating layer 150 but also the first insulating layer 130 and be connected to the lower metal layer BML. In case that the lower metal layer BML is a portion of a line that transmits signals or voltages, the source electrode SE may be connected to and electrically coupled to the lower metal layer BML to receive the voltage and the like provided to the line. In another embodiment, in case that the lower metal layer BML is a floating pattern instead of a separate line, the voltage and the like provided to the source electrode SE may be transmitted to the lower metal layer BML.

The source electrode SE and the drain electrode DE may include aluminum (Al), copper (Cu), titanium (Ti), or the like, and may be formed of a multi-layer or a single layer. In some embodiments, the source electrode SE and the drain electrode DE may have a multi-layer structure of Ti/Al/Ti, but are not limited thereto.

The semiconductor layer ACT, the gate electrode GE, the source electrode SE, and the drain electrode DE described above may form a thin film transistor, which is a switching element. In some embodiments, the thin film transistor may be positioned in the first light emitting area ELA1, the second light emitting area ELA2, and the third light emitting area ELA3, respectively. In some embodiments, a portion of the thin film transistor may also be positioned in the non-light emitting area NELA.

The third insulating layer 155 may be disposed on the second insulating layer 150 to cover the thin film transistor. In some embodiments, the third insulating layer 155 may be a passivation layer.

In some embodiments, the third insulating layer 155 may include an inorganic material. For example, the third insulating layer 155 may include the inorganic material exemplified in the description of the first insulating layer 130.

The fourth insulating layer 160 may be disposed on the third insulating layer 155 to cover the third insulating layer 155. In some embodiments, the fourth insulating layer 160 may be a planarization film.

The fourth insulating layer 160 may be formed of an organic material. In some embodiments, the fourth insulating layer 160 may include an acrylic resin, an epoxy resin, an imide resin, an ester resin, or the like, or may include a photosensitive organic material, but is not limited thereto.

Anode electrodes ANO may be positioned on the fourth insulating layer 160 in the display area DPA.

The anode electrodes ANO may overlap each of the first light emitting area ELA1, the second light emitting area ELA2, and the third light emitting area ELA3 in a plan view, and at least some of the anode electrodes ANO may extend to the non-light emitting area NELA. The anode electrodes ANO may be connected to the drain electrode DE of the thin film transistor.

In some embodiments, the anode electrode ANO may be a reflective electrode, and the anode electrode ANO may be a metal layer including a metal such as Ag, Mg, Al, Pt, Pd, Au, Ni, Nd, Ir, and Cr. In another embodiment, the anode electrode ANO may further include a metal oxide layer stacked on the metal layer. In an embodiment, the anode electrode ANO may have a multi-layer structure, for example, a two-layer structure such as ITO/Ag, Ag/ITO, ITO/Mg, and ITO/MgF, or a three-layer structure such as ITO/Ag/ITO.

The pixel defining film 170 may be disposed on the anode electrodes ANO. The pixel defining film 170 may define a first light emitting area ELA1, a second light emitting area ELA2, and a third light emitting area ELA3, respectively, as openings exposing the anode electrodes ANO.

The pixel defining film 170 may overlap a light blocking area BA of a color filter layer CFL, which will be described below, in the third direction DR3. The pixel defining film 170 may also overlap a bank BK, which will be described below, in the third direction DR3.

The pixel defining film 170 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB), but is not limited thereto.

A light emitting layer OL may be disposed on the anode electrode ANO. In some embodiments, the light emitting layer OL may have a shape of a continuous film formed over the light emitting areas and the non-light emitting area NELA. In some embodiments, the light emitting layer OL may be positioned only in the display area DPA, but is not limited thereto. For example, a portion of the light emitting layer OL may be further positioned in the non-display area NDA.

In some embodiments, the light emitting layer OL may include an organic layer including an organic material. The organic layer may include an organic light emitting layer, and may further include a hole injection layer, a transporting layer, an electron injection layer, and/or a transporting layer as an auxiliary layer to assist light emission in an embodiment.

In some embodiments, in case that the display device 10 is a micro LED display device or a nano LED display device, the light emitting layer OL may include an inorganic material such as an inorganic semiconductor.

A cathode electrode CE may be disposed on the light emitting layer OL. In some embodiments, the cathode electrode CE may be disposed on the light emitting layer OL and have a shape of a continuous film formed over the light emitting areas ELA1, ELA2, and ELA3 and the non-light emitting area NELA. In other words, the cathode electrode CE may completely cover the light emitting layer OL.

The cathode electrode CE may have semi-permeability or permeability. In case that the cathode electrode CE has a thickness of several tens to several hundreds of angstroms, the cathode electrode CE may have semi-permeability. In some embodiments, in case that the cathode electrode CE has the semi-permeability, the cathode electrode CE may include Ag, Mg, Cu, Al, Pt, Pd, Au, Ni, Nd, Ir, Cr, Li, Ca, LiF/Ca, LiF/Al, Mo, Ti, or a compound or mixture thereof, for example, a mixture of Ag and Mg. The cathode electrode CE may include transparent conductive oxide and may have permeability. In some embodiments, in case that the cathode electrode CE has the permeability, the cathode electrode CE may include tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), or the like.

The anode electrode ANO, the light emitting layer OL, and the cathode electrode CE may form light emitting elements ED. For example, the anode electrode ANO, the light emitting layer OL, and the cathode electrode CE overlapping the first light emitting area ELA1 may form a first light emitting element, the anode electrode ANO, the light emitting layer OL, and the cathode electrode CE overlapping the second light emitting area ELA2 may form a second light emitting element, and the anode electrode ANO, the light emitting layer OL, and the cathode electrode CE overlapping the third light emitting area ELA3 may form a third light emitting element. The first light emitting element, the second light emitting element, and the third light emitting element may each emit light. The emitted light from each light emitting element ED may have a peak wavelength in a range of about 440 nm to about 480 nm. For example, the emitted light may be blue light.

The thin film encapsulation layer TFEL may be disposed on the light emitting element layer EML. The thin film encapsulation layer TFEL may be disposed on the cathode electrode CE. The thin film encapsulation layer TFEL may serve to protect components positioned below from external substances such as moisture. The thin film encapsulation layer TFEL may be commonly disposed in the first light emitting area ELA1, the second light emitting area ELA2, the third light emitting area ELA3, and the non-light emitting area NELA.

The thin film encapsulation layer TFEL may include a lower inorganic layer TFE1, an organic layer TFE2, and an upper inorganic layer TFE3 sequentially stacked on the cathode electrode CE.

The lower inorganic layer TFE1 may completely cover the cathode electrode CE in the display area DPA and cover the first light emitting element, the second light emitting element, and the third light emitting element. The organic layer TFE2 may be disposed on the lower inorganic layer TFE1 and cover the first light emitting element, the second light emitting element, and the third light emitting element. The upper inorganic layer TFE3 may be disposed on the organic layer TFE2 and completely cover the organic layer TFE2.

In some embodiments, each of the lower inorganic layer TFE1 and the upper inorganic layer TFE3 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like, but is not limited thereto.

In some embodiments, the organic layer TFE2 may be made of an acrylic resin, a methacrylic resin, polyisoprene, a vinyl resin, an epoxy resin, a urethane resin, a cellulose resin, a perylene resin, or the like, but is not limited thereto.

A counter substrate TSUB may be disposed on the substrate SUB on which the light emitting element layer EML and the thin film encapsulation layer TFEL are disposed. A color filter layer CFL and a wavelength conversion layer WCL disposed on a surface of the color filter layer CFL may be disposed on a surface of the counter substrate TSUB. The display device 10 may include a low refractive layer LR and a first capping layer CPL1 disposed between the color filter layer CFL and the wavelength conversion layer WCL, and may include a spacer layer SPC disposed on a surface of the wavelength conversion layer WCL.

The color filter layer CFL may be disposed on another side of the counter substrate TSUB in the third direction DR3, for example, between the counter substrate TSUB and the substrate SUB. The color filter layer CFL may include a filtering pattern area and a light blocking pattern portion BM. The light blocking pattern portion BM may surround the filtering pattern area in a plan view. The filtering pattern of the color filter layer CFL may define a light transmitting area, and the light blocking pattern portion BM may define a light blocking area BA.

The color filter layer CFL may include a first color filter 321, a second color filter 322, and a third color filter 323 as illustrated in FIG. 6. The first color filter 321 may absorb all of second light and third light except for first light, the second color filter 322 may absorb all of the first light and the third light except for the second light, and the third color filter 323 may absorb all of the first light and the second light except for the third light. In other words, the first color filter 321 may transmit the first light, the second color filter 322 may transmit the second light, and the third color filter 323 may transmit the third light.

In some embodiments, the first color filter 321 may be a blue color filter and may include a blue colorant. In the specification, a colorant may include a dye and a pigment. The first color filter 321 may include a base resin, and the blue colorant may be dispersed in the base resin. In some embodiments, the second color filter 322 may be a red color filter and may include a red colorant. The second color filter 322 may include a base resin, and the red colorant may be dispersed in the base resin. In some embodiments, the third color filter 323 may be a green color filter and may include a green colorant. The third color filter 323 may include a base resin, and the green colorant may be dispersed in the base resin.

The first color filter 321 may include a first filtering pattern area 321*a* and a first light blocking pattern area 321*b* surrounding the first filtering pattern area 321*a*, the second color filter 322 may include a second filtering pattern area 322*a* and a second light blocking pattern area 322*b* surrounding the second filtering pattern area 322*a*, and the third color filter 323 may include a third filtering pattern area 323*a* and a third light blocking pattern area 323*b* surrounding the third filtering pattern area 323*a*.

For example, the first filtering pattern area 321*a* of the first color filter 321 may overlap a first light transmitting area TA1, and the first light blocking pattern area 321*b* of the first color filter 321 may surround the first filtering pattern area 321*a* overlapping the first light transmitting area TA1, and may not overlap the second light transmitting area TA2 and the third light transmitting area TA3 and may overlap the light blocking area BA in a plan view. The second filtering pattern area 322*a* of the second color filter 322 may overlap a second light transmitting area TA2, and the second light blocking pattern area 322*b* of the second color filter 322 may surround the second filtering pattern area 322*a* overlapping the second light transmitting area TA2, and may not overlap the first light transmitting area TA1 and the third light transmitting area TA3 and may overlap the light blocking area BA in a plan view. The third filtering pattern area 323*a* of the third color filter 323 may overlap a third light transmitting area TA3, and the third light blocking pattern area 323*b* of the third color filter 323 may surround the third filtering pattern area 323*a* overlapping the third light transmitting area TA3, and may not overlap the first light transmitting area TA1 and the second light transmitting area TA2 and may overlap the light blocking area BA in a plan view. In other words, the filtering pattern area of a color filter member 320 may include the first filtering pattern area 321*a* of the first color filter 321, the second filtering pattern area 322*a* of the second color filter 322, and the third filtering pattern area 323*a* of the third color filter 323, and the light blocking pattern portion BM may have a structure in which the first light blocking pattern area 321*b* of the first color filter 321, the second light blocking pattern area 322*b* of the second color filter 322, and the third light blocking pattern area 323*b* of the third color filter 323 are stacked.

The first filtering pattern area 321*a* of the first color filter 321 may function as a blocking filter that blocks red light and green light. For example, the first filtering pattern area 321*a* may selectively transmit the first light (e.g., blue light) and may block or absorb the second light (e.g., red light) and the third light (e.g., green light).

The second filtering pattern area 322*a* of the second color filter 322 may function as a blocking filter that blocks blue light and green light. Specifically, the second filtering pattern area 322*a* may selectively transmit the second light (e.g., red light) and may block or absorb the first light (e.g., blue light) and the third light (e.g., green light).

The third filtering pattern area 323*a* of the third color filter 323 may function as a blocking filter that blocks blue light and red light. Specifically, the third filtering pattern area 323*a* may selectively transmit the third light (e.g., green light) and may block or absorb the first light (e.g., blue light) and the second light (e.g., red light).

In some embodiments, the light blocking pattern portion BM may have a structure in which the first light blocking pattern area 321*b*, the third light blocking pattern area 323*b*, and the second light blocking pattern area 322*b* are sequentially stacked in the third direction DR3, but is limited thereto. In another embodiment, the light blocking pattern portion BM may not be made of the color filters 321, 322, and 323 described above, but may be formed of a separate organic light blocking material through a coating and exposure process of the organic light blocking material. Hereinafter, for convenience of explanation, it will be described that the light blocking pattern has a structure in which the first light blocking pattern area 321*b*, the third light blocking pattern area 323*b*, and the second light blocking pattern area 322*b* are sequentially stacked. The light blocking pattern portion BM may absorb all of the first light, the second light, and the third light through the above-described configuration.

The low refractive layer LR may be disposed on a surface of the color filter layer CFL, for example, on another side of the color filter layer CFL in the third direction DR3. As the low refractive layer LR has a lower refractive index than a first light transmitting member TPL, a second light transmitting member WCL1, and a third light transmitting member WCL2, which will be described below, the low refractive layer LR may serve to recycle light by inducing total reflection of light traveling from the first light transmitting member TPL, the second light transmitting member WCL1, and the third light transmitting member WCL2 by the low refractive layer LR.

The low refractive layer LR may include an organic material. In some embodiments, a refractive index of the low refractive layer LR may be less than or equal to about 1.3. In case that the refractive index of the low refractive layer LR is less than or equal to about 1.3, total reflection of light may sufficiently occur because a difference in refractive index between the low refractive layer LR and the first light transmitting member TPL, the second light transmitting member WCL1, and the third light transmitting member WCL2.

The low refractive layer LR may serve to compensate for and planarize steps caused by the light blocking pattern areas 321*b*, 322*b*, and 323*b* of the color filter layer CFL. Accordingly, the first capping layer CPL1 disposed on the low refractive layer LR may be formed flat.

The first capping layer CPL1 may be disposed on a surface of the low refractive layer LR and cover the low refractive layer LR. The first capping layer CPL1 may prevent impurities such as moisture or air permeating into the low refractive layer LR or the color filter layer CFL from the outside from damaging or contaminating the low refractive layer LR and the light blocking pattern portion BM and the filtering pattern area of the color filter member 320.

The first capping layer CPL1 may include an inorganic material. In some embodiments, the first capping layer CPL1 may include an inorganic material such as $SiO_2$, $SiN_x$, or SiON, and may be formed of a single layer or a multi-layer, but is not limited thereto.

The wavelength conversion layer WCL may be disposed on a surface of the first capping layer CPL1. The wavelength conversion layer WCL may include a bank BK, a first light transmitting member TPL, a second light transmitting member WCL1, a third light transmitting member WCL2, and a second capping layer CPL2.

With reference to FIG. 6, the banks BK may be disposed on another side of the first capping layer CPL1 in the third direction DR3 and spaced apart from each other in the second direction DR2 to form spaces for accommodating the light transmitting members. For example, the bank BK may serve to partition the space in which the light transmitting members are disposed. The bank BK may be in direct contact with the another side of the first capping layer CPL1 in the third direction DR3. The bank BK may surround the light transmitting members in a plan view. The bank BK may overlap the non-light emitting area NELA and the light blocking area BA in a plan view. The bank BK may not overlap the light emitting areas ELA1, ELA2, and ELA3 and the light transmitting areas TA1, TA2, and TA3 in a plan view.

In some embodiments, the bank BK may include an organic material that is photocurable or an organic material that is photocurable and include a light blocking material, but is not limited thereto.

The first light transmitting member TPL may overlap the first light transmitting area TA1, the second light transmitting member WCL1 may overlap the second light transmitting area TA2, and the third light transmitting member WCL2 may overlap the third light transmitting area TA3 in a plan view. The first light transmitting member TPL, the second light transmitting member WCL1, and the third light transmitting member WCL2 may be referred to as a wavelength conversion layer or a wavelength conversion material layer.

The first light transmitting member TPL may be disposed in the spaces partitioned by the bank BK and overlap the first light emitting area ELA1 and the first light transmitting area TA1 in the third direction DR3. The first light transmitting member TPL may be in direct contact with the first capping layer CPL1 and the bank BK.

The first light transmitting member TPL may be a light transmitting pattern that transmits incident light. The first light transmitting member TPL may directly transmit light of a first color emitted from the light emitting element layer EML. For example, the emitted light provided from the first light emitting element may be blue light as described above, and may transmit through the first light transmitting member TPL and the first filtering pattern area 321*a* of the first color filter 321 and be emitted to the outside of the display device 10. In other words, first emitted light L1 that transmits through the first light transmitting area TA1 from the first light emitting area ELA1 and is emitted to the outside may be blue light.

The first light transmitting member TPL may include a base resin 330 and light scatterers 331.

The base resin 330 may be made of an organic material with high light transmittance. In some embodiments, the base resin 330 may include an organic material such as an epoxy resin, an acrylic resin, a cardo resin, or an imide resin, but is not limited thereto.

The light scatterer 331 and the base resin 330 may have different refractive indices and form an optical interface. The light scatterer 331 may be a light scattering particle. The light scatterer 331 may scatter light in a random direction irrespective of an incident direction of the incident light without substantially converting a wavelength of the light transmitted through the first light transmitting area TA1.

The light scatterer 331 may include metal oxide particles or organic particles as a material that scatters at least a portion of transmitted light. In some embodiments, the light scatterers 331 may include titanium oxide ($TiO_2$), zirconium oxide (ZrO2), aluminum oxide ($Al_2O_3$), indium oxide ($In_2O_3$), zinc oxide (ZnO), tin oxide ($SnO_2$), or the like as metal oxide, or may include an acrylic resin, a urethane resin, or the like as the organic particles, but is not limited thereto.

The second light transmitting member WCL1 may be disposed in the spaces partitioned by the bank BK and overlap the second light emitting area ELA2 and the second light transmitting area TA2 in the third direction DR3. The second light transmitting member WCL1 may be in direct contact with the first capping layer CPL1 and the bank BK.

The second light transmitting member WCL1 may be a wavelength conversion pattern that converts or shifts a peak wavelength of the incident light to light having another specific peak wavelength and emits the light having another specific peak wavelength. The second light transmitting member WCL1 may convert the light of the first color emitted from the light emitting element layer EML into light of a second color and emit the light of the second color. For example, the emitted light provided from the second light emitting element may be blue light as described above, and may transmit through the second light transmitting member WCL1 and the second filtering pattern area 322*a* of the second color filter 322, be converted into red light having a peak wavelength in a range of about 610 nm to about 650 nm, and be emitted to the outside of the display device 10. In other words, second emitted light L2 that transmits through the second light transmitting area TA2 from the second light emitting area ELA2 and is emitted to the outside may be red light.

The second light transmitting member WCL1 may include a base resin 330, light scatterers 331 dispersed in the base resin 330, and first wavelength shifters 332 dispersed in the base resin 330.

The first wavelength shifter 332 may convert or shift the peak wavelength of the incident light into another specific peak wavelength. The first wavelength shifter 332 may convert the emitted light, which is the blue light provided from the second light emitting element, into red light having a peak wavelength in a range of 610 nm to about 650 nm and emit the red light.

In some embodiments, the first wavelength shifter 332 may be a quantum dot, a quantum rod, or a phosphor, but is not limited thereto. Hereinafter, for convenience of explanation, it will be described that the first wavelength shifter 332 is a quantum dot. The quantum dot may be a particulate material that emits a specific color as electrons transition from a conduction band to a valence band. The quantum dot may be a semiconductor nano-crystal material. The quantum dot may have a specific bandgap according to the composition and size to absorb light and emit light having a unique wavelength. Examples of the semiconductor nano-crystal of the quantum dot may include group IV nano-crystal, group II-VI compound nano-crystal, group III-V compound nano-crystal, group IV-VI nano-crystal, or a combination thereof.

The group II-VI compound may include: a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures of thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compound may include: a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

A group IV-VI compound may include: a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. A group IV element may include Si, Ge, and mixtures thereof. A group IV compound may include a binary compound selected from the group consisting of SiC, SiGe, and mixtures thereof.

The binary compound, the ternary compound, or the quaternary compound may be present in a particle at a uniform concentration or may be present in a same particle in a state of partially different concentration distributions. The quantum dot may have a core/shell structure in which one quantum dot surrounds another quantum dot. An interface between the core and the shell may have a concentration gradient in which a concentration of the element present in the shell decreases toward the center.

In some embodiments, the quantum dot may have a core-shell structure including a core including the above-described nanocrystals and a shell surrounding the core. The shell of the quantum dot may serve as a protective layer for maintaining semiconductor properties by preventing chemical modification of the core and/or a charging layer for imparting electrophoretic properties to the quantum dot. The shell may be a single layer or a multi-layer. An interface between the core and the shell may have a concentration gradient in which a concentration of the element present in the shell decreases toward the center. Examples of the shell of the quantum dot may include a metal oxide, a non-metal oxide, a semiconductor compound, or a combination thereof.

For example, examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, but the disclosure is not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the disclosure is not limited thereto.

The light emitted by the first wavelength shifter 332 may have an emission wavelength spectrum full width of half maximum (FWHM) of less than or equal to about 45 nm. For example, the light emitted by the first wavelength shifter 332 may have an emission wavelength spectrum full width of half maximum (FWHM) of less than or equal to about 40 nm. For example, the light emitted by the first wavelength shifter 332 may have an emission wavelength spectrum full width of half maximum (FWHM) of less than or equal to about 30 nm. Within these ranges, color purity and color reproducibility of colors displayed by the display device 10 may be further improved. The light emitted by the first wavelength shifter 332 may be emitted in several directions regardless of the incident direction of the incident light. Through this, side visibility of the second color displayed in the second light transmitting area TA2 may be improved.

Some of the emitted light provided from the second light emitting element may not be converted into the red light by the first wavelength shifter 332 and may be emitted by transmitting through the second light transmitting member WCL1. The component among the emitted light whose wavelength is not converted by the second light transmitting member WCL1 and entering the second filtering pattern area 322*a* of the second color filter 322 may be blocked by the second filtering pattern area 322*a*. On the other hand, the red light among the emitted light converted by the second light transmitting member WCL1 may transmit through the second filtering pattern area 322*a* and be emitted to the outside. For example, the second emitted light L2 emitted to the outside of the display device 10 through the second light transmitting area TA2 may be the red light.

The third light transmitting member WCL2 may be disposed in the spaces partitioned by the bank BK and overlap the third light emitting area ELA3 and the third light transmitting area TA3 in the third direction DR3. The third light transmitting member WCL2 may be in direct contact with the first capping layer CPL1 and the bank BK.

The third light transmitting member WCL2 may be a wavelength conversion pattern that converts or shifts a peak wavelength of the incident light to light having another specific peak wavelength and emits the light having another specific peak wavelength. For example, the emitted light provided from the third light emitting element may be blue light as described above, and may transmit through the third light transmitting member WCL2 and the third filtering pattern area 323*a* of the third color filter 323, be converted into green light having a peak wavelength in a range of about 510 nm to about 550 nm, and be emitted to the outside of the display device 10. In other words, third emitted light L3 that transmits through the third light transmitting area TA3 in the third light emitting area ELA3 and is emitted to the outside may be the green light.

The third light transmitting member WCL2 may include a base resin 330, light scatterers 331 dispersed in the base resin 330, and second wavelength shifters 333 dispersed in the base resin 330.

The second wavelength shifter 333 may convert or shift the peak wavelength of the incident light into another specific peak wavelength. The second wavelength shifter 333 may convert the emitted light, which is the blue light provided from the third light emitting element, into green light having a peak wavelength in a range of about 510 nm to about 550 nm and emit the green light. In some embodiments, the second wavelength shifter 333 may be a quantum dot, a quantum rod, or a phosphor, but is not limited thereto. In case that the second wavelength shifter 333 is a quantum dot, the second wavelength shifter 333 and the first wavelength shifter 332 may have substantially the same configuration, and thus a description thereof will be omitted.

Some of the emitted light provided from the third light emitting element may not be converted into the green light by the second wavelength shifter 333 and may be emitted by transmitting through the third light transmitting member WCL2. The component among the emitted light whose wavelength is not converted by the third light transmitting member WCL2 and entering the third filtering pattern area 323*a* of the third color filter 323 may be blocked by the third filtering pattern area 323*a*. On the other hand, the green light among the emitted light converted by the third light transmitting member WCL2 may transmit through the third filtering pattern area 323*a* and be emitted to the outside. For example, the third light L3 emitted to the outside of the display device 10 through the third light transmitting area TA3 may be the green light.

The second capping layer CPL2 may be disposed on the bank BK, the first light transmitting member TPL, the second light transmitting member WCL1, and the third light transmitting member WCL2, and sever to prevent impurities such as moisture or air permeating from the outside from damaging or contaminating the first light transmitting member TPL, the second light transmitting member WCL1, and the third light transmitting member WCL2. The second capping layer CPL2 may cover the first light transmitting member TPL, the second light transmitting member WCL1, and the third light transmitting member WCL2.

The spacer layer SPC may be disposed on a surface of the second capping layer CPL2. The spacer layer SPC may maintain a cell gap between the substrate SUB and the counter substrate TSUB. The spacer layer SPC may surround the light transmitting members in a plan view. The spacer layer SPC may overlap the non-light emitting area NELA and the light blocking area BA in a plan view. The spacer layer SPC may not overlap the light emitting areas ELA1, ELA2, and ELA3 and the light transmitting areas TA1, TA2, and TA3 in a plan view.

In some embodiments, the spacer layer SPC may include a transparent organic material that is photocurable or an organic material that is photocurable and include a light blocking material, but is not limited thereto. In some embodiments, the spacer layer SPC may be made of an acrylic resin, a methacrylic resin, polyisoprene, a vinyl resin, an epoxy resin, a urethane resin, a cellulose resin, a perylene resin, or the like, but is not limited thereto.

A filling layer FIL may be disposed between the counter substrate TSUB and the substrate SUB. The filling layer FIL may be interposed between the wavelength conversion layer WCL and the thin film encapsulation layer TFEL and fill a space between the wavelength conversion layer WCL and the thin film encapsulation layer TFEL. In some embodiments, the filling layer FIL may be in direct contact with the upper inorganic layer TFE3 of the thin film encapsulation layer TFEL and the second capping layer CPL2 of the wavelength conversion layer WCL, but is not limited thereto.

In some embodiments, the filling layer FIL may be made of a material having an extinction coefficient of substantially zero. There is a correlation between the refractive index and the extinction coefficient, and as the refractive index decreases, the extinction coefficient also decreases. In case that the refractive index is 1.7 or less, the extinction coefficient may substantially converge to zero. In some embodiments, the filling layer FIL may be made of a material having a refractive index of less than or equal to about 1.7, and accordingly, it may be possible to prevent or minimize light provided from the self-light emitting element from being absorbed while passing through the filling layer FIL. In some embodiments, the filling layer FIL may be made of an organic material having a refractive index in a range of about 1.4 to about 1.6.

The first to third light transmitting members TPL, WCL1, and WCL2 of the display device 10 described above may be formed by spraying ink onto a substrate. The ink may be supplied through an inlet of a print head unit, and the remaining ink after being dispersed through nozzles may be circulated through an outlet. However, as the inkjet printing process continues, impact distribution of ink may increase rapidly at some point, which may cause coating defects.

Hereinafter, an inkjet printing apparatus that may prevent an increase in impact distribution of the inkjet printing apparatus will be described.

Figure 7:
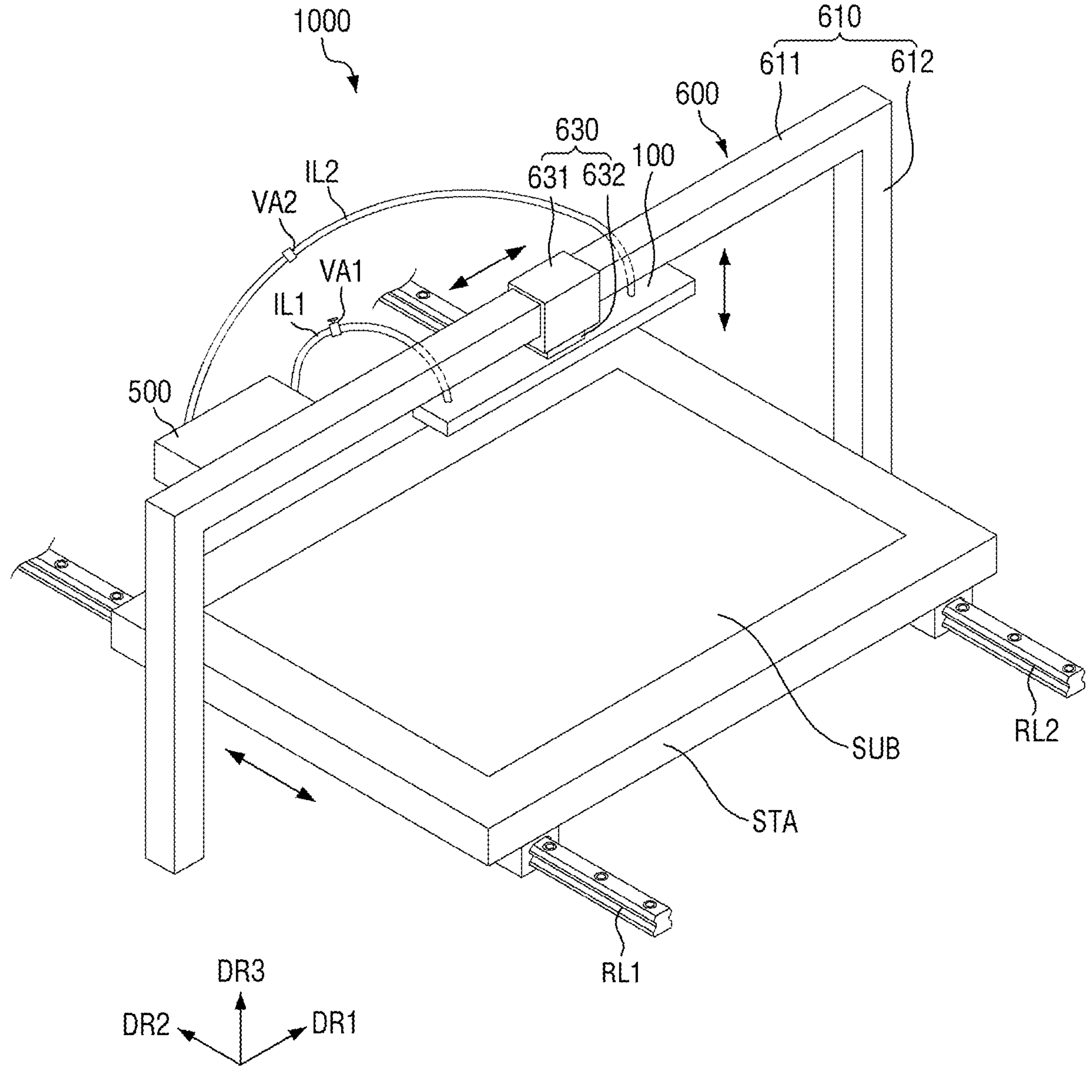
FIG. 7 is a schematic perspective view of an inkjet printing apparatus according to an embodiment.
Figure 8:
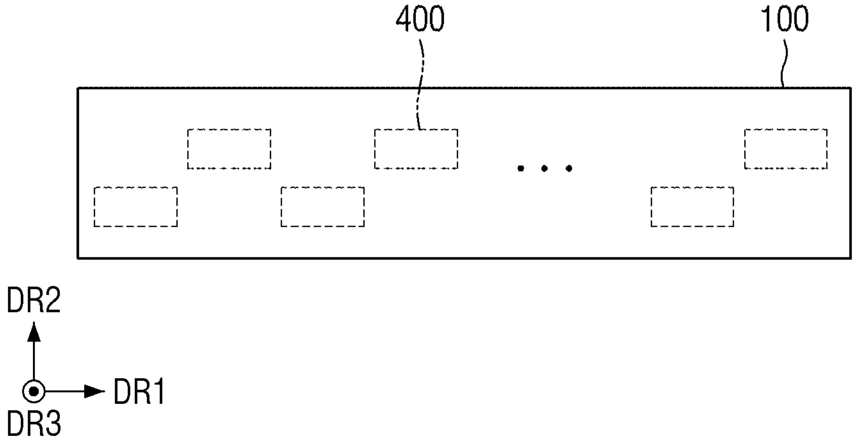
FIG. 8 is a schematic bottom view of a print head unit according to an embodiment.
Figure 9:
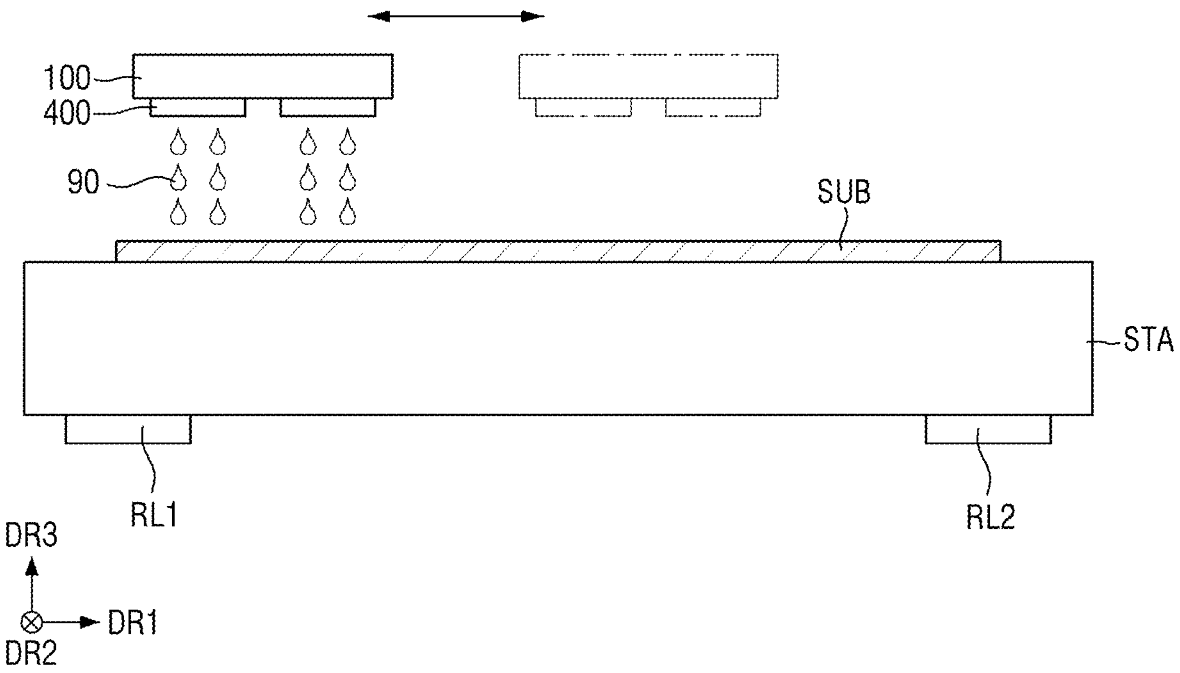
FIG. 9 is a schematic view illustrating an operation of the print head unit according to an embodiment.
Figure 10:
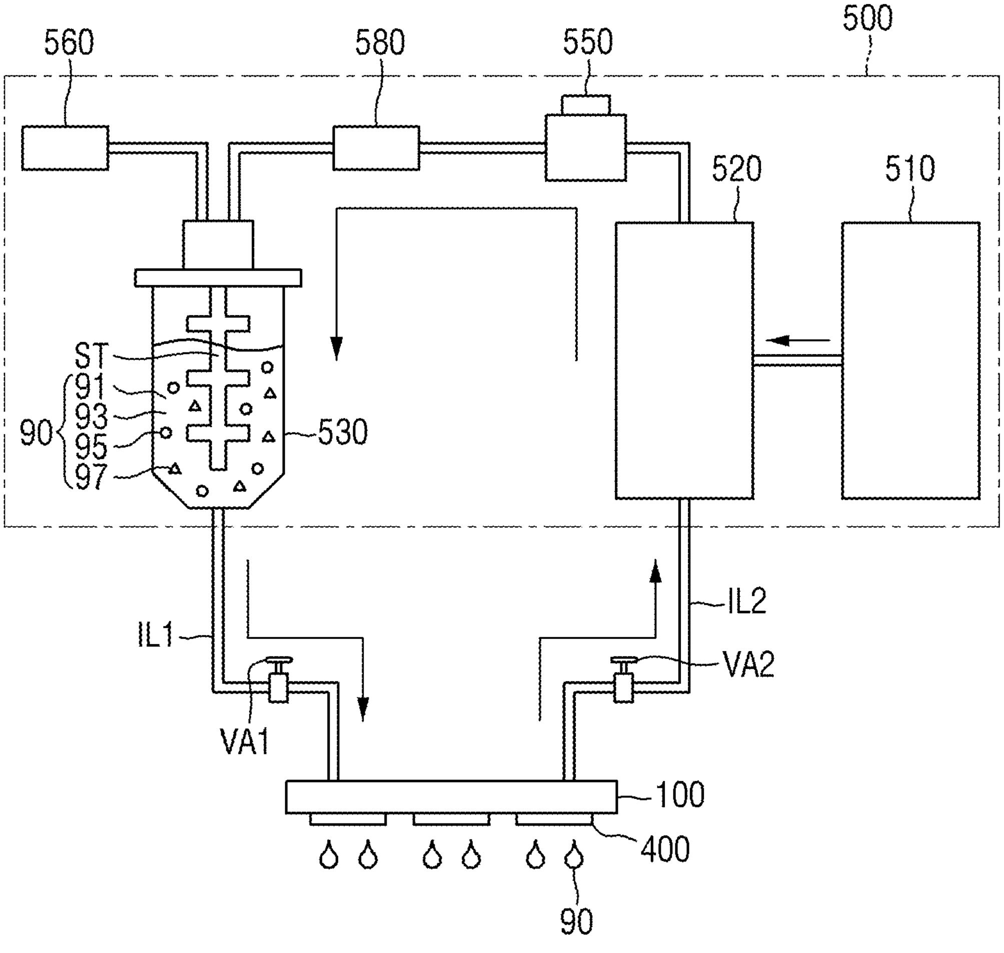
FIG. 10 is a schematic view illustrating an ink circulation unit, a suction unit, and a print head unit according to an embodiment.
Figure 11:
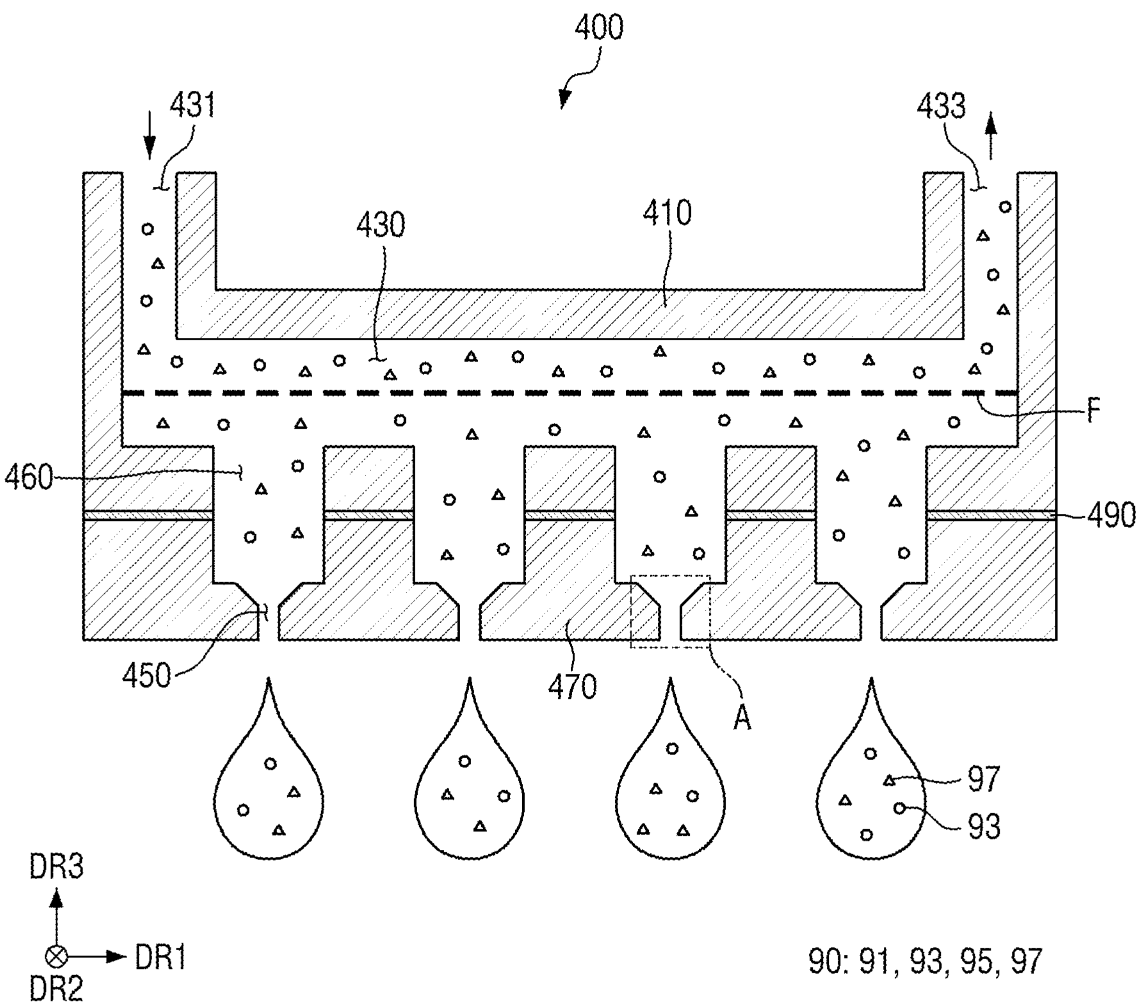
FIG. 11 is a schematic cross-sectional view of an inkjet head according to an embodiment.
Figure 12:
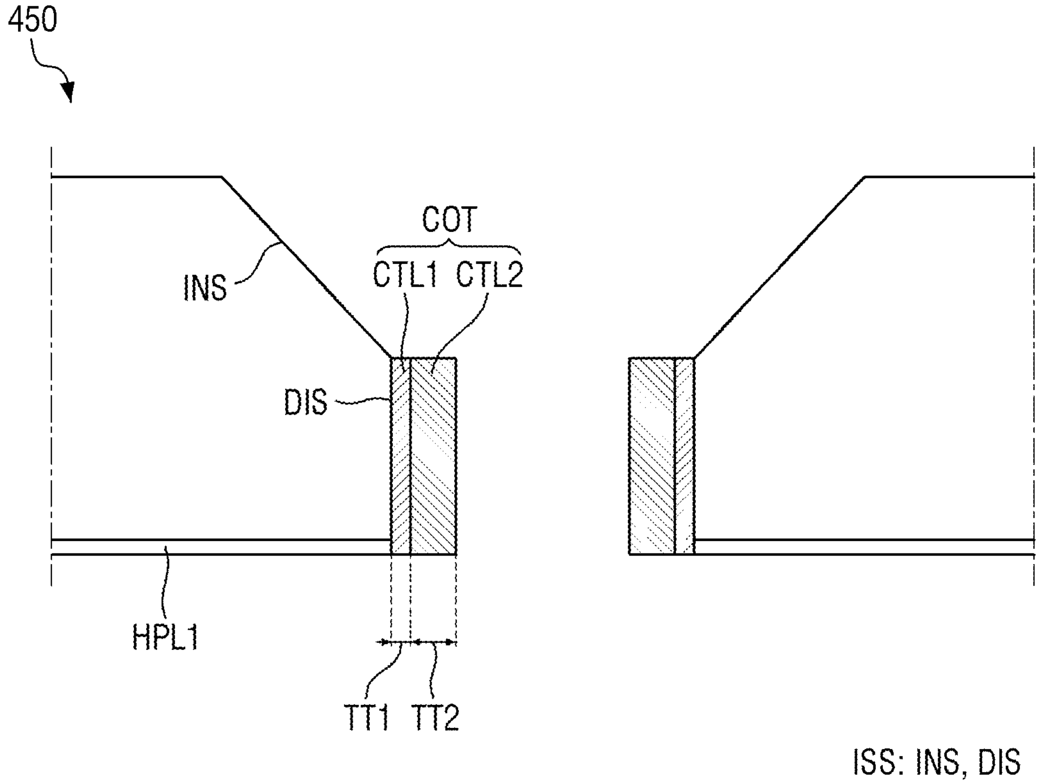
FIG. 12 is an enlarged view of area A of FIG. 11.

FIG. 7 is a schematic perspective view of an inkjet printing apparatus according to an embodiment. FIG. 8 is a schematic bottom view of a print head unit according to an embodiment. FIG. 9 is a schematic view illustrating an operation of the print head unit according to an embodiment. FIG. 10 is a schematic view illustrating an ink circulation unit, a suction unit, and a print head unit according to an embodiment. FIG. 11 is a schematic cross-sectional view of an inkjet head according to an embodiment. FIG. 12 is an enlarged view of area A of FIG. 11. FIG. 9 schematically illustrates a shape of a print head unit 100 and a stage STA viewed from the front according to an embodiment.

Referring to FIGS. 7 to 11, an inkjet printing apparatus 1000 according to an embodiment may include a print head unit 100 including multiple inkjet heads 400. The inkjet printing apparatus 1000 may further include a stage STA, an ink circulation unit 500, and a base frame 600.

The inkjet printing apparatus 1000 may spray ink 90 onto a substrate SUB using the print head unit 100. The ink 90 may be coated on the substrate SUB to form the first to third light transmitting members TPL, WCL1, and WCL2 of the wavelength conversion layer WCL.

The stage STA may provide an area in which the substrate SUB is disposed. The inkjet printing apparatus 1000 may include a first rail RL1 and a second rail RL2 extending in the second direction DR2, and the stage STA may be disposed on the first rail RL1 and the second rail RL2. The stage STA may move in the second direction DR2 on the first rail RL1 and the second rail RL2 through a separate moving member. However, the disclosure is not limited thereto. Although the drawing illustrates a structure in which the stage STA moves, in another embodiment, the stage STA may be fixed and the print head unit 100 may move, and the print head unit 100 may be mounted on a frame disposed on the first rail RL1 and the second rail RL2.

The print head unit 100 may include multiple inkjet heads 400 and be disposed on the base frame 600. The print head unit 100 may spray ink 90 on the substrate SUB using the inkjet head 400 connected to a separate ink storage unit.

The base frame 600 may include a support portion 610 and a moving unit 630. The support portion 610 may include a first support portion 611 extending in the first direction DR1 which is a horizontal direction, and a second support portion 612 connected to the first support portion 611 and extending in the third direction DR3 which is a vertical direction. An extension direction of the first support portion 611 may be the same as the first direction DR1 which is a long side direction of a probe device 700. The print head unit 100 may be disposed on the moving unit 630 mounted on the first support portion 611.

The moving unit 630 may include a moving portion 631 mounted on the first support portion 611 and capable of moving in a direction, and a fixing portion 632 disposed on a lower surface of the moving portion 631 and on which the print head unit 100 is disposed. The moving portion 631 may move in the first direction DR1 on the first support portion 611, and the print head unit 100 may be fixed to the fixing portion 632 and move in the first direction DR1 together with the moving portion 631.

The print head unit 100 may be disposed on the base frame 600 and spray the ink 90 provided from the ink storage onto the substrate SUB through the inkjet head 400. The print head unit 100 may be spaced apart from the stage STA passing under the base frame 600 at a certain distance. The spaced distance between the print head unit 100 and the stage STA may be adjusted by a height of the second support portion 612 of the base frame 600. The spaced distance between the print head unit 100 and the stage STA may be adjusted within a range in which the print head unit 100 has a certain interval from the substrate SUB in case that the substrate SUB is disposed on the stage STA to secure a space for the printing process.

According to an embodiment, the print head unit 100 may include an inkjet head 400 including multiple nozzles 450. The inkjet head 400 may be disposed on a lower surface of the print head unit 100.

The inkjet heads 400 may be spaced apart from each other in a direction and may be arranged in a column or multiple columns. It is illustrated in the drawing that the inkjet heads 400 are disposed in two columns and the inkjet heads 400 in each column are disposed to cross each other. However, the inkjet heads 400 are not limited thereto, and may be arranged in a larger number of columns and may overlap each other rather than crossing each other. A shape of the inkjet head 400 is not particularly limited, and according to an embodiment, the inkjet head 400 may have a quadrangular shape in a plan view.

At least one inkjet head 400, for example, two inkjet heads 400 may be disposed adjacent to each other to form a pack. However, the number of inkjet heads 400 included in one pack is not limited therefore, and for example, the number of inkjet heads 400 included in one pack may be 1 to 5. The drawing illustrates only six inkjet heads 400 disposed in the print head unit 100, but this is for schematic illustration of the print head unit 100 and the number of inkjet heads 400 is not limited thereto.

The inkjet head 400 disposed in the print head unit 100 may spray the ink 90 on the substrate SUB disposed on the stage STA. According to an embodiment, the print head unit 100 may move in a direction on the first support portion 611, and the inkjet head 400 may move in a direction to spray the ink 90 on the target substrate SUB.

The print head unit 100 may move in the first direction DR1 in which the first support portion 611 extends, and the inkjet head 400 may move in the first direction DR1 and spray the ink 90 on the target substrate SUB.

In some embodiments, a width of the substrate SUB measured in the first direction DR1 may be greater than a width of the print head unit 100, and the print head unit 100 may move in the first direction DR1 and entirely spray the ink 90 on the substrate SUB. However, the print head unit 100 is not limited thereto, and may be positioned outside the first rail RL1 and the second rail RL2 and move in the first direction DR1 to spray the ink 90 on the substrate SUB. In case that the stage STA moves in the second direction DR2 and is positioned under the base frame 600, the print head unit 100 may move between the first rail RL1 and the second rail RL2 and spray the ink 90 through the inkjet head 400. The operation of the inkjet head 400 is not limited thereto, and may be modified in various ways within the technical art.

The inkjet printing apparatus 1000 may further include an ink circulation unit 500. The ink circulation unit 500 may supply the ink 90 to the print head unit 100, and the inkjet head 400 may discharge the supplied ink 90. The ink 90 may circulate through the ink circulation unit 500 and the inkjet head 400, and some of the ink 90 supplied to the inkjet head 400 may be discharged from the inkjet head 400, and the remaining portion may be supplied back to the ink circulation unit 500.

The ink circulation unit 500 may be connected to the inkjet head 400 through a first connection pipe IL1 and the second connection pipe IL2. For example, the ink circulation unit 500 may supply the ink 90 to the inkjet head 400 through the first connection pipe IL1, and a flow rate of the supplied ink 90 may be adjusted through a first valve VAL. The remaining portion of the ink 90 remaining after being discharged from the inkjet head 400 may be supplied to the ink circulation unit 500 through the second connection pipe IL2. A flow rate of the ink 90 supplied to the ink circulation unit 500 through the second connection pipe IL2 may be adjusted through a second valve VA2. As the ink 90 circulates through the ink circulation unit 500, a deviation in the number of particles, such as quantum dots, of light transmitting members included in the ink 90 discharged from the inkjet head 400 may be minimized.

The ink circulation unit 500 may be mounted on the base frame 600, but is not limited thereto. The ink circulation unit 500 may be provided in the inkjet printing apparatus 1000, but the position or shape thereof is not particularly limited. For example, the ink circulation unit 500 may be disposed on a separate device, and if connected to the inkjet head 400, various arrangements may be possible within that range.

In some embodiments, the ink circulation unit 500 may include a first circulation ink storage unit 510, a second circulation ink storage unit 520, a third circulation ink storage unit 530, a circulation pump 550, a compressor 560, and a flow meter 580. The second circulation ink storage unit 520, the circulation pump 550, and the third circulation ink storage unit 530 of the ink circulation unit 500 may be connected to the inkjet head 400, and may form one ink circulation system.

The first circulation ink storage unit 510 may be a storage unit where ink 90 is prepared. The ink 90 including a solvent 91, wavelength shifters 95, and scatterers 97 may be prepared in the first circulation ink storage unit 510 of the ink circulation unit 500, and may be supplied to the ink circulation system.

The second circulation ink storage unit 520 may be connected to the first circulation ink storage unit 510 so that the prepared ink 90 may be supplied. The ink 90 remaining after being discharged from the inkjet head 400 may be supplied to the second circulation ink storage unit 520 through the second connection pipe IL2. The second circulation ink storage unit 520 may be positioned between the third circulation ink storage unit 530, the inkjet head 400, and the first circulation ink storage unit 510 to form an ink circulation system. In case that the second circulation ink storage unit 520 is omitted, excessive ink 90 may be supplied to the third circulation ink storage unit 530, resulting in poor dispersion of solids in the ink. The ink circulation unit 500 may include the second circulation ink storage unit 520 to prevent excessive ink 90 from being supplied to the third circulation ink storage unit 530. For example, the second circulation ink storage unit 520 may serve as a buffer storage unit in which a portion of the ink 90 circulated in the ink circulation system may be stored.

The ink 90 supplied to the second circulation ink storage unit 520 may be supplied to the third circulation ink storage unit 530 through the circulation pump 550. The circulation pump 550 may be a pump that transmits power to a fluid so that the ink 90 in the ink circulation system may be circulated. The ink 90 supplied to the second circulation ink storage unit 520 may be supplied to the third circulation ink storage unit 530 by the circulation pump 550. The flow meter 580 may be provided between the circulation pump 550 and the third circulation ink storage unit 530, and may measure a flow rate of the ink 90 supplied to the third circulation ink storage unit 530. The circulation pump 550 may adjust the flow rate of the ink 90 supplied to the third circulation ink storage unit 530 according to the flow rate of the ink 90 measured by the flow meter 580.

The ink circulation unit 500 may further include a compressor 560, and the compressor 560 may adjust pressure in the third circulation ink storage unit 530. The compressor 560 may remove gas so that the inside of the third circulation ink storage unit 530 is in a vacuum state, or may introduce an external inert gas so that the inside of the third circulation ink storage unit 530 has a predetermined or selectable pressure. However, the compressor 560 of the ink circulation unit 500 is not limited thereto and may also be omitted.

The third circulation ink storage unit 530 may be connected to the second circulation ink storage unit 520 through a circulation pump 550 and supplied with the ink 90. The third circulation ink storage unit 530 may supply the ink 90 to the inkjet head 400 through the first connection pipe ILL. In an embodiment, the third circulation ink storage unit 530 may include a stirrer ST, and the stirrer ST may disperse the wavelength shifters 95 and the scatterers 97 in the ink 90. The ink 90 supplied to the third circulation ink storage unit 530 may maintain a state in which the wavelength shifters 95 and the scatterers 97 are dispersed without being settled as the stirrer ST rotates. For example, the stirrer ST of the third circulation ink storage unit 530 may prevent the number of wavelength shifters 95 and scatterers 97 in the ink 90 discharged through the inkjet head 400 from decreasing, as the wavelength shifters 95 and scatterers 97 are settled on a lower portion of the third circulation ink storage unit. The third circulation ink storage unit 530 may supply the ink 90 in which the wavelength shifters 95 and the scatterers 97 are evenly dispersed to the inkjet head 400, and the inkjet head 400 may discharge the ink 90 including the wavelength shifters 95 and the scatterers 97 at a certain level or higher.

In an embodiment, the ink 90 may include a solvent 91, and a base resin 93, wavelength shifters 95, and scatterers 97 included in the solvent 91. In an embodiment, the ink 90 may be provided in a solution or colloid state. For example, the solvent 91 may be acetone, water, alcohol, toluene, propylene glycol (PG), propylene glycol methyl acetate (PGMA), triethylene glycol monobutyl ether (TGBE), diethylene glycol monophenyl ether (DGPE), an amide-based solvent, a dicarbonyl-based solvent, diethylene glycol dibenzoate, a tricarbonyl-based solvent, triethly citrate, a phthalate solvent, benzyl butyl phthalate, bis(2-ethlyhexyl) phthalate, bis(2-ethylhexyl) isophthalate, ethyl phthalyl ethyl glycolate, or the like, but is not limited thereto. The base resin 93, the wavelength shifters 95, and the scatterers 97 may be dispersed in the solvent 91, and supplied to the print head unit 100 and discharged.

Referring to FIG. 11, the inkjet head 400 may include multiple nozzles 450 and may discharge the ink 90 through the nozzles 450. The ink 90 discharged from the nozzles 450 may be sprayed on the substrate SUB provided on the stage STA. The nozzles 450 may be positioned on a bottom surface of the inkjet head 400 and may be arranged in a direction in which the inkjet head 400 extends.

The inkjet head 400 may include a base portion 410, an inner pipe 430, a piezo chamber 460, multiple nozzles 450, a discharge portion 470, and an actuator 490.

The base portion 410 may constitute a main body of the inkjet head 400. The base portion 410 may be attached to the print head unit 100. As described above, the base portion 410 may have a shape extending in the first direction DR1 and the second direction DR2. However, the base portion 410 is not limited thereto and may have a circular or polygonal shape.

The discharge portion 470 may be a portion of the base portion 410 of the inkjet head 400 where the piezo chamber 460 and the nozzle 450 are disposed. It is illustrated in the drawing that the discharge portion 470 connected to the base portion 410 and discharge portions 470 spaced apart from the base portion 410 are disposed, and the piezo chamber 460 and the nozzle 450 are formed between the discharge portions 470. However, the discharge portions 470 may be substantially one member that is integrated without being spaced apart from each other, and the nozzle 450 may be formed in a shape of a hole penetrating through the discharge portion 470. For example, the discharge portions 470 may be formed as one member without being spaced apart from each other. However, the disclosure is not limited thereto, and in another embodiment, the inkjet head 400 may include multiple units including the discharge portions 470 with the nozzles 450 formed between the discharge portions 470. The discharge portions 470 may be spaced apart from each other and connected to the base portion 410.

The inner pipe 430 may be disposed in the base portion 410 and connected to an internal flow path of the print head unit 100, and the ink 90 may be supplied from the ink circulation unit 500. The ink 90 may be supplied to the print head unit 100 through the first connection pipe IL1 connected to the ink circulation unit 500, and the ink 90 remaining after being discharged from the nozzle 450 may be supplied to the ink circulation unit 500 through the second connection pipe IL2. The ink 90 may be supplied to the inner pipe 430 of the inkjet head 400 from an inlet 431 connected to the internal flow path of the print head unit 100, and the ink 90 remaining after being discharged may exit into the internal flow path through an outlet 433. The inlet 431 may be connected to the first connection pipe IL1, and the outlet 433 may be connected to the second connection pipe IL2. The inlet 431 may be disposed at an end of the inner pipe 430, and the outlet 433 may be disposed at another end of the inner pipe 430, for example, on an opposite side of the inlet 431 of the inner pipe 430.

The inkjet head 400 may include a filter F disposed in the inner pipe 430. The filter F may prevent substances other than the wavelength shifters 95 or the scatterers 97 from flowing into the nozzles 450 in case that the ink 90 flowing along the inner pipe 430 flows into the nozzles 450. Accordingly, it may be possible to prevent the nozzles 450 from being clogged by foreign substances or from mixing foreign substances in the ink 90 discharged from the nozzles 450.

The nozzles 450 may be disposed on the discharge portion 470 positioned on a surface, for example, the lower surface of the base portion 410. The nozzles 450 may be spaced apart from each other and arranged in an extension direction of the base portion 410, and may be connected to the inner pipe 430 through the piezo chamber 460 penetrating through the discharge portion 470 of the base portion 410 to discharge the ink 90. Although not illustrated in the drawing, the nozzles 450 may be arranged in one column or multiple columns. It is illustrated in the drawing that four nozzles 450 are formed in the inkjet head 400, but the disclosure is not limited thereto. In some embodiments, the number of nozzles 450 included in the inkjet head 400 may be in a range of about 128 to about 1800. The nozzle 450 may discharge the ink 90 flowing into the piezo chamber 460 along the inner pipe 430. The amount of ink 90 sprayed through the nozzles 450 may be adjusted according to a voltage applied to each nozzle 450. In an embodiment, the amount of ink 90 sprayed from each nozzle 450 at one time may be in a range of about 1 to about 50 pico-litter (pl), but is not limited thereto.

The ink 90 discharged through the nozzles 450 may include a solvent 91, a base resin 93, wavelength shifters 95, and scatterers 97. According to an embodiment, the wavelength shifters 95 and the scatterers 97 may be randomly dispersed in the ink 90, and flow along the inner pipe 430 and be supplied to the nozzles 450.

The piezo chamber 460 may be disposed between the nozzles 450 and the inner pipe 430 to temporarily store the ink 90 before the ink 90 is discharged through the nozzles 450. In case that hydraulic pressure of the actuator 490 is applied to the piezo chamber 460, the ink 90 may be discharged through the nozzles 450. The piezo chamber 460 may be connected to a lower portion of the inner pipe 430 and may be disposed to correspond to the nozzles 450, respectively.

The actuator 490 may be disposed on the discharge portion 470 of the base portion 410. The actuator 490 may surround the piezo chamber 460 in a plan view. The actuator 490 may apply hydraulic pressure to the ink 90 flowing into the piezo chamber 460 so that the ink 90 may be readily discharged through the nozzles 450. The actuator 490 and the discharge portion 470 may have substantially the same length, but is not limited thereto. The actuator 490 may be disposed to correspond to and surround the piezo chamber 460, and may be spaced apart from other actuators 490 by an interval at which the piezo chambers 460 are spaced apart from each other.

The actuator 490 may control the amount of ink 90 discharged from the piezo chamber 460 through the nozzle 450. The actuator 490 may adjust the hydraulic pressure applied to the ink 90, and adjust the amount of droplets of ink 90 discharged in a unit space during the printing process of the inkjet printing apparatus 1000. For example, the amount of ink 90 discharged from the nozzle 450 at one time may be in a range of about 1 to about 50 pico-litter (pl), and in one printing process, the discharge amount of ink 90 required per unit space may be greater than or equal to about 50 pl. The actuator 490 may control the amount of droplets of the ink 90 discharged from the nozzle 450 in one printing process by adjusting the strength or frequency of hydraulic pressure.

Referring to FIG. 12 together with FIG. 11, the nozzle 450 may include an inner side surface ISS through which the ink 90 is discharged. The inner side surface ISS may define a passage through which the ink 90 moves to be discharged from the nozzle 450. The inner side surface ISS may be an inclined surface extending to the inner pipe 430 and at least partially having a slope. The inner side surface ISS may be formed in a shape forming a slope in which the width of the nozzle 450 decreases toward the lower portion and extending in a vertical direction.

The inner side surface ISS may include an inclined surface INS and a discharge surface DIS. The inclined surface INS may be a surface of the inner side surface ISS of the nozzle 450 extending from the inner pipe 430 and may be an inclined surface having a slope. The discharge surface DIS may be a surface connecting the inclined surface INS and a lower surface of the discharge portion 470. For example, the discharge surface DIS may extend in the third direction DR3 and may be perpendicular to the lower surface of the discharge portion 470.

A first liquid-repellent layer HPL1 may be disposed below the discharge portion 470. The first liquid-repellent layer HPL1 may function to prevent the ink 90 discharged through the nozzle 450 from spreading to the lower surface of the discharge portion 470.

The first liquid-repellent layer HPL1 may be a coating layer including a liquid-repellent material. The coating layer including the liquid-repellent material may include, for example, at least one of polyimide, perfluoroalkoxy (PFA), fluorinated ethylene propylene (FEP), ethylene tetrafluoroethylene (ETFE), and poly tetrafluoroethylene (PTFE). The coating layer including the liquid-repellent material may include at least one of an alkyl group ($-C_nH_{2n+1}$), a fluorocarbon group ($-C_xF_y$), and a fluorine group.

The first liquid-repellent layer HPL1 may have a thickness in a range of about 1 nm to about 100 nm. The first liquid-repellent layer HPL1 may be formed by a method such as dipping, jetting, and evaporation, but is not limited thereto.

In an embodiment, the nozzle 450 may include a coating layer COT disposed on the inner side surface ISS. The coating layer COT may be disposed to be in direct contact with the discharge surface DIS of the inner side surface ISS of the nozzle 450. The coating layer COT may be spaced apart from the inclined surface INS of the nozzle 450 and may not be disposed on the inclined surface INS. The coating layer COT may be disposed on a side surface of the first liquid-repellent layer HPL1, and may extend from the side surface of the first liquid-repellent layer HPL1 to the inner side surface ISS of the nozzle 450. For example, the coating layer COT may be disposed on the discharge surface DIS of the nozzle 450 and the side surface of the first liquid-repellent layer HPL1.

The coating layer COT may include a first coating layer CTL1 and a second coating layer CTL2. The first coating layer CTL1 may be disposed on the discharge surface DIS of the nozzle 450 and disposed in direct contact with the discharge surface DIS. The second coating layer CTL2 may be disposed on the first coating layer CTL1 and may be disposed in direct contact with the first coating layer CTL1. The second coating layer CTL2 may be spaced apart from the discharge surface DIS of the nozzle 450 and may not be in contact with the discharge surface DIS.

The first coating layer CTL1 may include at least one of elements from groups II to VI. For example, the first coating layer CTL1 may include at least one of Cd, Se, Te, Zn, S, Mg, In, Ga, Sb, Al, and Pb. In an embodiment, the first coating layer CTL1 may include at least one of Zn, Se, In, and S.

A thickness TT1 of the first coating layer CTL1 may be in a range of about 10 nm to about 100 nm. The thickness may be a distance measured in the first direction DR1 from the discharge surface DIS of the nozzle 450. In an embodiment, the thickness TT1 of the first coating layer CTL1 may be in a range of about 10 nm to about 50 nm, but is not limited thereto.

The second coating layer CTL2 may include AlOF. A thickness TT2 of the second coating layer CTL2 may be in a range of about 40 nm to about 900 nm. In an embodiment, the thickness TT2 of the second coating layer CTL2 may be in a range of about 100 nm to about 500 nm, but is not limited thereto.

A total thickness of the coating layer COT including the first coating layer CTL1 and the second coating layer CTL2 may be in a range of about 50 nm to about 1000 nm, but is not limited thereto. The thickness of the coating layer COT may be adjusted within a range that does not increase impact distribution of the ink 90 discharged through the nozzle 450. In case that the total thickness of the coating layer COT exceeds 1000 nm, the impact distribution of the ink 90 may rapidly increase, resulting in coating defects. Here, the impact distribution may mean a distance between central ink and outermost ink discharged on the substrate SUB. For example, by managing the total thickness of the coating layer COT, the increase in impact distribution of the ink 90 may be prevented.

As described above, the inkjet printing apparatus 1000 according to the disclosure may improve impact distribution of ink by forming the coating layer COT including the first coating layer CTL1 and the second coating layer CTL2 and adjusting the thickness of the coating layer COT.

Figure 13:
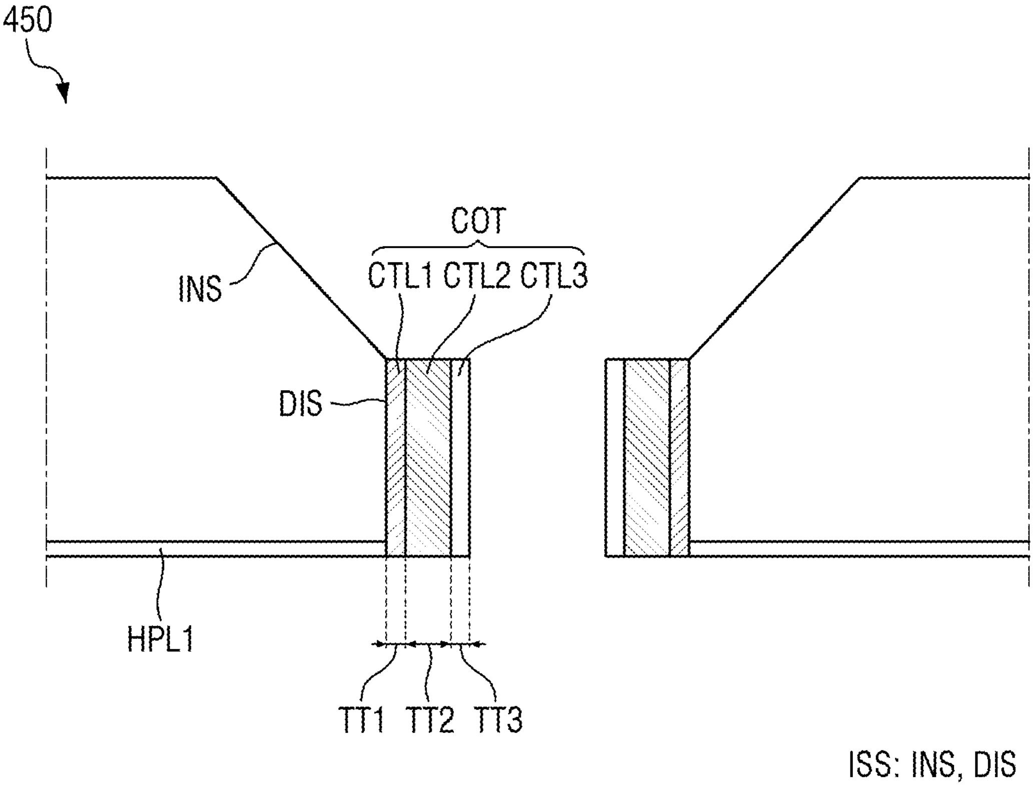
FIG. 13 is a schematic cross-sectional view illustrating a nozzle of an inkjet printing apparatus according to another embodiment.

FIG. 13 is a schematic cross-sectional view illustrating a nozzle of an inkjet printing apparatus according to another embodiment.

Referring to FIG. 13, the embodiment is different from the embodiment of FIG. 12 described above in that the coating layer COT further includes a third coating layer CTL3. Hereinafter, overlapping descriptions of the same configuration as the above-described embodiment will be omitted and differences from the above-described embodiment will be described.

The coating layer COT may include a first coating layer CTL1, a second coating layer CTL2, and a third coating layer CTL3.

The third coating layer CTL3 may be disposed on the second coating layer CTL2 and may be in direct contact with the second coating layer CTL2. The third coating layer CTL3 may be spaced apart from the discharge surface DIS of the nozzle 450 and may not be in contact with the discharge surface DIS, and may be spaced apart from the first coating layer CTL1 and may not be in contact with the first coating layer CTL1.

The third coating layer CTL3 may include a metal oxide. For example, the third coating layer CTL3 may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In an embodiment, the third coating layer CTL3 may include titanium oxide.

The third coating layer CTL3 may be formed by stacking multiple metal oxide particles. For example, the third coating layer CTL3 may include titanium oxide particles. The titanium oxide particles may be spherical (amorphous) or rod-shaped, and the rod-shaped particles may be in anatase or rutile phase. A size of the titanium oxide particles may be in a range of about 100 nm to about 500 nm, but is not limited thereto.

In another embodiment, the metal oxide particles may include aluminum (Al). For example, the titanium oxide particles may be coated with a layer of aluminum.

The thickness TT3 of the third coating layer CTL3 and the size of the metal oxide particles may be the same, for example, the thickness TT3 of the third coating layer CTL3 may be in a range of about 100 nm to about 500 nm, but is not limited thereto.

In case that the coating layer COT includes the first coating layer CTL1, the second coating layer CTL2, and the third coating layer CTL3, a total thickness of the coating layer COT may be in a range of about 10 nm to about 1000 nm.

The inkjet printing apparatus 1000 according to the disclosure may improve impact distribution of ink by forming the coating layer COT including the first coating layer CTL1, the second coating layer CTL2, and the third coating layer CTL3 and adjusting the thickness of the coating layer COT.

Figure 14:
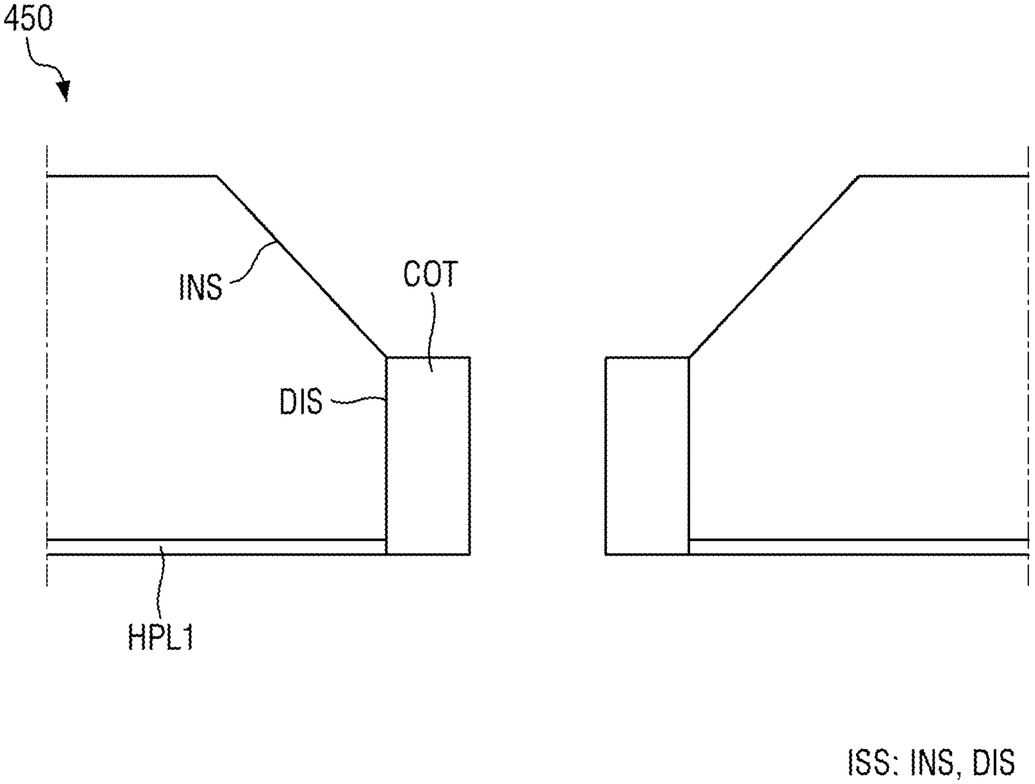
FIG. 14 is a schematic cross-sectional view illustrating a nozzle of an inkjet printing apparatus according to still another embodiment.

FIG. 14 is a schematic cross-sectional view illustrating a nozzle of an inkjet printing apparatus according to still another embodiment.

Referring to FIG. 14, the embodiment is different from the embodiments of FIGS. 12 and 13 described above in that the coating layer COT is a single layer in which the components of the above-described first to third coating layers CTL are mixed.

The coating layer COT may include materials of the first coating layer CTL1, the second coating layer CTL2, and the third coating layer CTL3 described above.

In an embodiment, the coating layer COT may include at least one of elements from groups II to VI, and AlOF. At least one of elements from groups II to VI, and AlOF may exist in a randomly mixed form in the coating layer COT.

In another embodiment, the coating layer COT may include at least one of elements from groups II to VI, AlOF, and a metal oxide. At least one of elements from groups II to VI, AlOF, and a metal oxide may exist in a randomly mixed form in the coating layer COT.

The coating layer COT may be formed of a single layer. In case that the coating layer COT is a single layer, the thickness of the coating layer COT may be in a range of about 50 nm to about 1000 nm. In an embodiment, the thickness of the coating layer COT may be in a range of about 100 nm to about 500 nm, but is not limited thereto.

As described above, the inkjet printing apparatus 1000 according to the disclosure may improve impact distribution of ink by firming the coating layer COT of the single layer and adjusting the thickness of the coating layer COT.

Figure 15:
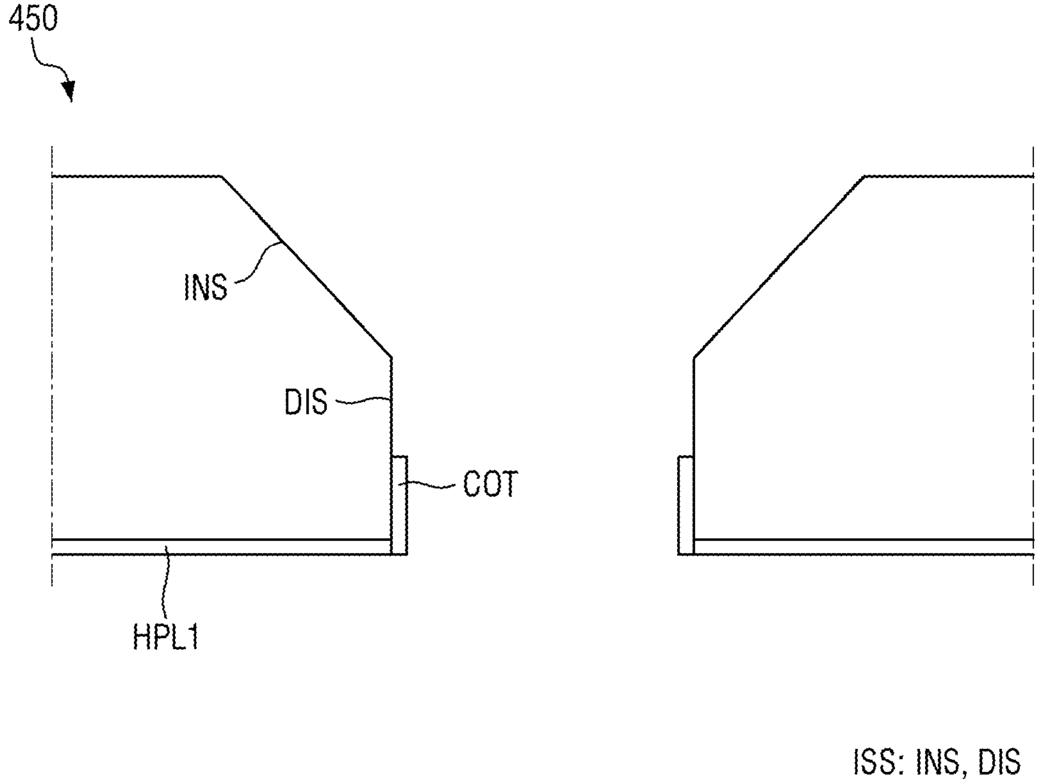
FIG. 15 is a schematic cross-sectional view illustrating a nozzle of an inkjet printing apparatus according to still another embodiment.

FIG. 15 is a schematic cross-sectional view illustrating a nozzle of an inkjet printing apparatus according to still another embodiment.

Referring to FIG. 15, the embodiment is different from the embodiments of FIGS. 12 to 14 described above in that the coating layer COT is a liquid-repellent coating layer.

The coating layer COT may be disposed on the discharge surface DIS of the inner side surface ISS of the nozzle 450. For example, the coating layer COT may be spaced apart from the inclined surface INS of the nozzle 450 and may be disposed on (e.g., directly disposed on) the discharge surface DIS. The coating layer COT may also be disposed on the side surface of the first liquid-repellent layer HPL1. The coating layer COT may extend from the side surface of the first liquid-repellent layer HPL1 to the inner side surface ISS of the nozzle 450. For example, the coating layer COT may be disposed on the discharge surface DIS and the side surface of the first liquid-repellent layer HPL1. The coating layer COT may be disposed on the side surface of the first liquid-repellent layer HPL1 and may be disposed on at least a portion of the discharge surface DIS.

A length of the coating layer COT may be greater than or equal to about at least 2 m in the thickness direction of the nozzle 450 (e.g., in the third direction DR3), and may be smaller than a length of the inner side surface of the nozzle 450 in the third direction DR3. For example, the length of the coating layer COT may be smaller than a length of the discharge surface DIS. The ink may form a concave meniscus in the third direction DR3 from an upper side of the coating layer COT within the nozzle 450. If the ink forms the meniscus within the nozzle 450, solids in the ink may be prevented from sticking. Therefore, coating defects may be reduced by preventing the solids from acting as foreign matter in the nozzle 450 and increasing the impact distribution of ink.

The coating layer COT may include a liquid-repellent material. The coating layer COT may include, for example, at least one of polyimide, perfluoroalkoxy (PFA), fluorinated ethylene propylene (FEP), ethylene tetrafluoroethylene (ETFE), and poly tetrafluoroethylene (PTFE). The coating layer COT may include at least one of an alkyl group (—CnH2n+1), a fluorocarbon group (—CxFy), and a fluorine group.

The coating layer COT may be formed to have a thickness in a range of about 1 nm to about 100 nm. The coating layer COT may be formed by a method such as dipping, jetting, and evaporation, but is not limited thereto.

As described above, the inkjet printing apparatus 1000 according to the disclosure may improve the impact distribution of the ink and reduce the coating defects by forming the coating layer COT including the liquid-repellent materials.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An inkjet printing apparatus comprising:

a base portion;

an inner pipe disposed in the base portion and through which ink moves; and a nozzle extending from the inner pipe and discharging the ink, wherein the nozzle includes a coating layer disposed on an inner side surface of the nozzle and including AlOF, the coating layer includes a first coating layer disposed on the inner side surface of the nozzle, and a second coating layer directly disposed on the first coating layer and including AlOF.

2. The inkjet printing apparatus of claim 1, wherein the nozzle further includes an inclined surface extending from the inner pipe, and a discharge surface extending from the inclined surface to a lower side of the nozzle, and the coating layer is disposed on the discharge surface.

3. The inkjet printing apparatus of claim 2, wherein the coating layer is spaced apart from the inclined surface and is in direct contact with the discharge surface.

4. The inkjet printing apparatus of claim 1, wherein the first coating layer includes at least one of a Group II element, a Group III element, a Group IV element, a Group V element, and a Group VI element.

5. The inkjet printing apparatus of claim 4, wherein the first coating layer includes at least one of Cd, Se, Te, Zn, S, Mg, In, Ga, Sb, Al, and Pb.

6. The inkjet printing apparatus of claim 1, wherein a thickness of the first coating layer is in a range of about 10 nm to about 100 nm.

7. The inkjet printing apparatus of claim 1, wherein a thickness of the second coating layer is in a range of about 40 nm to about 900 nm.

8. The inkjet printing apparatus of claim 1, further comprising:

a third coating layer disposed on the second coating layer, wherein the third coating layer includes a metal oxide.

9. The inkjet printing apparatus of claim 8, wherein a thickness of the third coating layer is in a range of about 100 nm to about 500 nm.

10. The inkjet printing apparatus of claim 1, wherein a thickness of the coating layer is in a range of about 50 nm to about 1000 nm.

11. The inkjet printing apparatus of claim 1, wherein the coating layer is formed of a single layer.

12. The inkjet printing apparatus of claim 11, wherein the coating layer includes at least one of a Group II element, a Group III element, a Group IV element, a Group V element, a Group VI element, AlOF, and a metal oxide.

* * * * *